US012704790B2

United States Patent

(12) United States Patent
Gdor et al.

(10) Patent No.: US 12,704,790 B2
(45) Date of Patent: Aug. 11, 2026

(54) SYSTEM AND METHOD FOR DETERMINING OVERLAY MEASUREMENT OF A SCANNING TARGET

(71) Applicant: KLA Corporation, Milpitas, CA (US)

(72) Inventors: Itay Gdor, Tel-Aviv (IL); Yonatan Vaknin, Yoqneam Llit (IL); Nireekshan K. Reddy, Tel Aviv (IL); Alon Alexander Volfman, Tel-Aviv (IL); Iftach Galon, Tel-Aviv (IL); Jordan Pio, Milpitas, CA (US); Yuval Lubashevsky, Haifa (IL); Nickolai Isakovitch, Tel-Aviv (IL); Andrew V. Hill, Sunriver, OR (US); Oren Lahav, Tel-Aviv (IL); Daria Negri, Nesher (IL); Vladimir Levinski, Migdal HaEmek (IL)

(73) Assignee: KLA Corporation, Milpitas, CA (US)

( * ) Notice: Subject to any disclaimer, the term of this patent is extended or adjusted under 35 U.S.C. 154(b) by 5 days.

(21) Appl. No.: 18/372,444

(22) Filed: Sep. 25, 2023

(65) Prior Publication Data

US 2024/0337952 A1 Oct. 10, 2024

Related U.S. Application Data

(60) Provisional application No. 63/457,137, filed on Apr. 4, 2023.

(51) Int. Cl.
*G03F 7/00* (2006.01)

(52) U.S. Cl.
CPC .... *G03F 7/70633* (2013.01); *G03F 7/706831* (2023.05); *G03F 7/706837* (2023.05); *G03F 7/706851* (2023.05); *G03F 7/70683* (2013.01)

(58) Field of Classification Search
CPC . H01L 22/12; G03F 7/70633; G03F 7/70681; G03F 7/70683; G03F 7/706831;
(Continued)

(56) References Cited

U.S. PATENT DOCUMENTS 4,577,968 A * 3/1986 Makosch ........... G01B 11/0608 356/494
4,947,413 A 8/1990 Jewell et al.
(Continued)

FOREIGN PATENT DOCUMENTS

CN 101251725 A 8/2008
CN 101299132 B 11/2008
(Continued)

OTHER PUBLICATIONS

Adel et al., "Diffraction order control in overlay metrology: a review of the roadmap options," Proc. SPIE. 6922, Metrology, Inspection, and Process Control for Microlithography XXII, pp. 692202-1 to 692202-19, Apr. 2008.
(Continued)

*Primary Examiner* — Gordon J Stock, Jr.
(74) *Attorney, Agent, or Firm* — Suiter Swantz IP

(57) ABSTRACT

A method may include receiving time-varying interference signals from two or more photodetectors associated with a first exposure structure and a second exposure structure in one or more cells as an overlay target is scanned in accordance with a metrology recipe, where the first exposure structure and the second exposure structure form a side-by-side grating, where the side-by-side grating includes one or more diffraction gratings, where at least one diffraction grating is a non-overlapping side-by-side grating, where the first exposure structure is arranged adjacent to the second exposure structure, where the side-by-side grating is periodic along the scan direction. The method may further
(Continued)

include determining an overlay error between one of the first exposure structure and the second exposure structure of the sample based on the time-varying interference signals, where the time-varying interference signals corresponding to the non-overlapping first exposure structure and second exposure structure are synchronized.

28 Claims, 17 Drawing Sheets

(58) Field of Classification Search
CPC ........... G03F 7/706833; G03F 7/70653; G03F 7/706843; G03F 7/706845; G03F 7/706847; G03F 7/706849; G03F 7/706851; G03F 7/706835; G03F 7/706837; G01B 11/24; G01B 11/27; G01B 11/272
See application file for complete search history.

(56) References Cited

U.S. PATENT DOCUMENTS 5,216,257 A 6/1993 Brueck et al.
5,414,514 A 5/1995 Smith et al.
5,808,731 A 9/1998 Kirk
5,895,735 A 4/1999 Yoon
5,914,204 A 6/1999 Lee
6,710,876 B1 * 3/2004 Nikoonahad ....... G03F 7/70633 356/399
6,958,819 B1 10/2005 Heaton et al.
7,230,703 B2 6/2007 Sezginer et al.
7,230,705 B1 6/2007 Yang et al.
7,247,843 B1 7/2007 Moon
7,440,105 B2 10/2008 Adel et al.
7,561,282 B1 7/2009 Widmann
7,602,491 B2 10/2009 Kandel et al.
7,671,990 B1 3/2010 Adel et al.
8,330,281 B2 12/2012 Ghinovker et al.
8,493,563 B2 7/2013 Kim et al.
8,564,143 B2 10/2013 Chen et al.
8,786,825 B2 7/2014 Kerkhof et al.
9,123,649 B1 9/2015 Manassen et al.
9,400,435 B2 7/2016 Liou et al.
9,618,448 B2 4/2017 Manassen et al.
9,709,903 B2 7/2017 Choi et al.
9,746,786 B2 8/2017 Lin et al.
9,785,059 B2 * 10/2017 Brill ..................... G01N 21/956
9,841,688 B2 12/2017 Ko et al.
9,846,359 B1 12/2017 Oh et al.
9,864,209 B2 1/2018 Levinski et al.
9,885,961 B1 2/2018 Amir
9,899,183 B1 2/2018 Zhuang et al.
10,163,806 B2 12/2018 Cai et al.
10,197,389 B2 2/2019 Levinski et al.
10,268,125 B2 4/2019 Peng et al.
10,437,163 B2 10/2019 Schaar et al.
10,474,040 B2 11/2019 Laske et al.
10,488,768 B2 11/2019 Auer et al.
10,527,952 B2 1/2020 Grunzweig et al.
10,585,357 B2 3/2020 Schaar et al.
10,606,178 B2 3/2020 Zwier
10,691,030 B2 6/2020 Staals et al.
10,824,079 B2 11/2020 Lubashevsky et al.
10,983,005 B2 4/2021 Wu et al.
11,073,768 B2 7/2021 Hill et al.
11,112,369 B2 9/2021 Gready
11,119,417 B2 9/2021 Manassen et al.
11,164,307 B1 11/2021 Feler et al.
11,300,405 B2 4/2022 Manassen et al.
11,300,524 B1 4/2022 Hill et al.
11,353,799 B1 6/2022 Volkovich et al.
11,378,394 B1 7/2022 Paskover et al.
11,409,205 B2 8/2022 Gdor et al.
11,428,642 B2 8/2022 Hill et al.
11,526,086 B2 12/2022 Hill et al.
11,604,149 B2 3/2023 Feler
11,796,925 B2 * 10/2023 Lubashevsky .... G03F 7/706843
11,822,254 B2 11/2023 Den Boef et al.
12,021,040 B2 6/2024 Lee et al.
12,044,982 B2 7/2024 Matsunobu
12,100,574 B2 9/2024 Gutman et al.
2001/0021477 A1 9/2001 Dirksen et al.
2002/0080364 A1 6/2002 Monshouwer et al.
2004/0066517 A1 * 4/2004 Huang ................. G01N 21/956 356/509
2004/0169861 A1 9/2004 Mieher et al.
2005/0012928 A1 1/2005 Sezginer et al.
2005/0195398 A1 9/2005 Adel et al.
2007/0077503 A1 4/2007 Yoo
2007/0229785 A1 10/2007 Den Boef et al.
2007/0229829 A1 10/2007 Kandel et al.
2007/0234786 A1 10/2007 Moon
2007/0242272 A1 10/2007 Suehira et al.
2007/0279630 A1 12/2007 Kandel et al.
2009/0042108 A1 2/2009 Yasuzato
2010/0267682 A1 10/2010 Johri et al.
2010/0277706 A1 11/2010 Schaar et al.
2011/0122496 A1 5/2011 Schaar et al.
2012/0033193 A1 2/2012 Schaar et al.
2012/0044470 A1 2/2012 Smilde et al.
2012/0133938 A1 5/2012 Deckers et al.
2012/0253325 A1 10/2012 Sniffin et al.
2013/0032712 A1 2/2013 Shih et al.
2013/0035888 A1 2/2013 Kandel et al.
2013/0107259 A1 5/2013 Choi et al.
2013/0193602 A1 8/2013 Suzuki et al.
2013/0252429 A1 9/2013 Okamoto et al.
2014/0065736 A1 3/2014 Amir et al.
2014/0240704 A1 8/2014 Komine et al.
2015/0138523 A1 5/2015 Jak et al.
2015/0177135 A1 6/2015 Amit et al.
2015/0235880 A1 8/2015 Inada et al.
2015/0293458 A1 10/2015 Vanoppen et al.
2016/0025484 A1 1/2016 Kim et al.
2016/0047744 A1 2/2016 Adel et al.
2016/0093574 A1 3/2016 Cai et al.
2016/0123894 A1 5/2016 Fu et al.
2016/0146740 A1 5/2016 Lu et al.
2016/0202620 A1 7/2016 Egashira et al.
2016/0223920 A1 8/2016 Tinnemans et al.
2016/0300767 A1 10/2016 Ko et al.
2016/0307850 A1 10/2016 Lin et al.
2016/0313658 A1 10/2016 Marciano et al.
2017/0146338 A1 5/2017 Allen
2017/0307367 A1 10/2017 Yaegashi et al.
2017/0351184 A1 12/2017 Peng et al.
2018/0024054 A1 1/2018 Moon et al.
2018/0246420 A1 8/2018 Pandey et al.
2018/0364179 A1 12/2018 Gready
2019/0004439 A1 1/2019 Lubashevsky et al.
2019/0033726 A1 1/2019 Adam et al.
2019/0049373 A1 2/2019 Levinski
2019/0101835 A1 4/2019 Chen
2019/0219931 A1 7/2019 Zwier
2019/0285996 A1 9/2019 Shibayama et al.
2019/0354024 A1 11/2019 Tsiatmas et al.
2020/0132446 A1 4/2020 Shalibo et al.
2020/0241429 A1 7/2020 Yang et al.
2021/0072650 A1 3/2021 Feler et al.
2021/0364279 A1 11/2021 Manassen et al.
2021/0364935 A1 11/2021 Gdor et al.
2022/0034652 A1 2/2022 Manassen et al.
2022/0214285 A1 7/2022 Hill et al.
2022/0252990 A1 8/2022 Javaheri et al.
2022/0317577 A1 10/2022 Manassen et al.
2022/0328365 A1 10/2022 Manassen et al.
2022/0342325 A1 10/2022 Mengel
2023/0133640 A1 5/2023 Hill et al.
2023/0213875 A1 * 7/2023 Lubashevsky ...... G03F 7/70633 356/496
2023/0314319 A1 10/2023 Manassen et al.
2023/0314344 A1 10/2023 Paskover et al.
2024/0004310 A1 1/2024 Blanton et al.

(56) References Cited

U.S. PATENT DOCUMENTS

| | | | |
|---|---|---|---|
| 2024/0068804 A1 | 2/2024 | Lubashevsky et al. | |
| 2024/0167813 A1 | 5/2024 | Gdor et al. | |
| 2024/0266234 A1 | 8/2024 | Yang et al. | |
| 2024/0280914 A1 | 8/2024 | Manassen et al. | |
| 2024/0302751 A1 | 9/2024 | Pio et al. | |
| 2024/0337953 A1* | 10/2024 | Gdor | G03F 7/70633 |

FOREIGN PATENT DOCUMENTS

| | | | |
|---|---|---|---|
| CN | 104346808 | A | 2/2015 |
| CN | 111766764 | A | 10/2020 |
| JP | H06160019 | A | 6/1994 |
| JP | H0886612 | A | 4/1996 |
| JP | 2514699 | B2 | 7/1996 |
| JP | 214765 | Y1 | 8/1998 |
| JP | 10214765 | A | 11/1998 |
| JP | 2000133576 | A | 5/2000 |
| JP | 2001093820 | A | 4/2001 |
| JP | 2002134394 | A | 5/2002 |
| JP | 2007140460 | | 2/2009 |
| JP | 2010267682 | A | 11/2010 |
| JP | 2011243664 | A | 12/2011 |
| JP | 2012253325 | A | 12/2012 |
| JP | 2013074258 | A | 4/2013 |
| JP | 2013254780 | | 7/2015 |
| JP | 2015154008 | A | 8/2015 |
| JP | 2015210140 | A | 11/2015 |
| KR | 101185992 | B1 | 9/2012 |
| KR | 20150121275 | A | 10/2015 |
| KR | 1020160121206 | A | 10/2016 |

OTHER PUBLICATIONS

Buttgereit, et al., "Phame(R)—high resolution off-axis phase shift measurements on 45nm node features," 24th European Mask and Lithography Conference, 2008, pp. 1-7, doi: 10.1117/12.798805.

Di, et al., "Moiré-Based Absolute Interferometry With Large Measurement Range in Wafer-Mask Alignment", IEEE Photonics Technology Letters, vol. 27, No. 4, pp. 435-438, 2015. doi:10.1109/LPT.2014.2377037.

Fesperman Jr., Ronnie Rex, (2006). Multiscale Alignment and Positioning System. (UMI 3264369) [Doctor of Philosophy, University of North Carolina] ProQuest Information and Learning Company.

International Search Report and Written Report in International Application No. PCT/US2021/061296 dated Mar. 24, 2022, 9 pages.

Kikuchi et al., "Principle and observation of fluorescence moiré fringes for alignment in print and imprint methods" J. Vac. Sci. Technol. B 35, 06G303 (2017); https://doi.org/10.1116/1.4990844, Submitted: Jun. 19, 2017 . Accepted: Aug. 31, 2017 . Published Online: Sep. 26, 2017.

Korean Intellectual Property Office, International Search Report and Written Opinion for International Application No. PCT/US2022/052061, Apr. 24, 2023, 10 pages.

Korean Intellectual Property Office, International Search Report and Written Opinion for International Application No. PCT/US2023/013654, Jun. 8, 2023, 12 pages.

Korean Intellectual Property Office, International Search Report and Written Opinion for International Application No. PCT/US2023/014005, Jun. 16, 2023, 8 pages.

Moon, et al., "Immunity to Signal Degradation by Overlayers Using a Novel Spatial-Phase-Matching Alignment System", J. Vac. Sci. Technol. B 13, 2648-2652 (1995).

PCT International Search Report and Written Opinion for International Application No. PCT/US2021/044111 dated Nov. 22, 2022, 9 pages.

Servin, et al., "Mask contribution on CD & OVL errors budgets for Double Patterning Lithography," 25th European Mask and Lithography Conference, 2009, pp. 1-13.

Wu, et al., (2012). Nanoimprint lithography with ≤60 nm overlay precision. Applied Physics A, 106, 767-772.

Zhou, et al., (2015). Moiré-Based Interferometry for Magnification Calibration of Bitelecentric Lens System. IEEE Photonics Journal. 7. 1-11. 10.1109/JPHOT.2015.2500892.

Zhou, et al., "Fourier-based analysis of moiré fringe patterns of superposed gratings in alignment of nanolithography", Optics Express, vol. 16, No. 11, p. 7869, 2008. doi: 10.1364/OE.16.007869.

Zhu et al. Four-quadrant gratings moire fringe alignment measurement in proximity lithography. Optics Express. Feb. 2013;21(3):3463-3473. DOI: 10.1364/OE.21.003463. PMID: 23481804.

Zhu, et al., (2015). Adjustment Strategy for Inclination Moiré Fringes in Lithography by Spatial Frequency Decomposition. IEEE Photonics Technology Letters. 27. 395-398. 10.1109/LPT.2014.2370072.

Zhou et al., "Moiré-Based Interferometry for Magnification Calibration of Bitelecentric Lens System," IEEE Photonics Journal, vol. 7, No. 6, Dec. 2015, 12 pages.

Korean Intellectual Property Office, International Search Report and Written Opinion received in International Application No. PCT/US2024/019477, Jul. 11, 2024, 9 pages.

Korean Intellectual Property Office, International Search Report and Written Opinion received in International Application No. PCT/US2024/020826, Jul. 17, 2024, 9 pages.

* cited by examiner

SYSTEM AND METHOD FOR DETERMINING OVERLAY MEASUREMENT OF A SCANNING TARGET

CROSS-REFERENCE TO RELATED APPLICATIONS

The present applicant claims the benefit under 35 U.S.C. § 119(e) of U.S. Provisional Application Ser. No. 63/457,137, filed on Apr. 4, 2023, which is incorporated herein by reference in the entirety.

TECHNICAL FIELD

The present disclosure relates generally to overlay metrology and, more particularly, to scanning scatterometry overlay metrology.

BACKGROUND

Overlay metrology generally refers to measurements of the relative alignment of layers on a sample such as, but not limited to, semiconductor devices. An overlay measurement, or a measurement of overlay error, typically refers to a measurement of the misalignment of fabricated features on two or more sample layers. In a general sense, proper alignment of fabricated features on multiple sample layers is necessary for proper functioning of the device.

Demands to decrease feature size and increase feature density are resulting in correspondingly increased demand for accurate and efficient overlay metrology systems. Metrology systems typically generate metrology data associated with a sample by measuring or otherwise inspecting overlay metrology targets distributed across the sample.

Overlay metrology targets are typically designed to provide diagnostic information regarding the alignment of multiple layers of a sample by characterizing an overlay target having target features located on sample layers of interest. Further, the overlay alignment of the multiple layers is typically determined by aggregating overlay measurements of multiple overlay targets at various locations across the sample.

Some overlay metrology targets (e.g., imaging AIM metrology targets) include features in multiple layers which are spatially separated in the plane of the sample and arranged to have a common center of symmetry, where overlay is measurement by the difference in the centers of symmetry between the layer-pairs of interest. Such metrology targets (e.g., imaging AIM metrology targets) require greater space on the sample. As such, in some cases it may not be possible to print two or more targets on top of each other, especially in cut mask process layers. Further, measurement of such metrology targets (e.g., imaging AIM metrology targets) is often performed using area imaging, where the measurement mode is less accurate and suffers from tool-induced-inaccuracy.

Additional overlay metrology targets include multiple single overlay targets measured sequentially (e.g., scatterometry overlay (SCOL) metrology targets or Moiré fringe metrology targets). Such metrology targets (e.g., SCOL metrology targets or Moiré fringe metrology targets) include periodic structures configured to produce diffraction patterns that may be analyzed to determine metrology measurements. The throughput of measurements in such metrology targets (e.g., SCOL metrology targets or Moiré fringe metrology targets), containing a plurality of cells occupy a larger surface area of a sample, are reduced as measurement time scales with each additional overlay metrology target to measure. Such metrology targets (e.g., SCOL metrology targets or Moiré fringe metrology targets) are often measuring using a scanning coherent spot which suffers from tool-induced-inaccuracy.

Therefore, it is desirable to provide systems and methods for curing the above deficiencies.

SUMMARY

An overlay metrology system is disclosed, in accordance with one or more embodiments of the present disclosure. In embodiments, the overlay metrology system includes an illumination sub-system. In embodiments, the illumination sub-system includes an illumination source configured to generate one or more illumination beams. In embodiments, the illumination sub-system includes one or more illumination optics configured to direct the one or more illumination beams to an overlay target on a sample as the sample is scanned relative to the one or more illumination beams along a scan direction when implementing a metrology recipe. In embodiments, the overlay target in accordance with the metrology recipe includes a side-by-side grating, where the side-by-side grating includes one or more diffraction gratings in one or more cells, where at least one diffraction grating is a non-overlapping side-by-side grating, where the side-by-side grating includes at least a first exposure structure and a second exposure structure, where the first exposure structure is arranged adjacent to the second exposure structure, where the side-by-side grating is periodic along the scan direction. In embodiments, the overlay metrology system includes a collection sub-system. In embodiments, the collection sub-system includes two or more photodetectors located in a pupil plane at two or more locations to capture diffraction orders from the side-by-side grating in the one or more cells when implementing the metrology recipe. In embodiments, the collection sub-system includes a controller communicatively coupled to the two or more photodetectors. In embodiments, the controller includes one or more processors configured to execute program instructions. In embodiments, the one or more processors are configured to execute program instructions to cause the one or more processors to receive time-varying interference signals from the two or more photodetectors associated with the side-by-side gratings in the one or more cells as the overlay target is scanned in accordance with the metrology recipe. In embodiments, the one or more processors are configured to execute program instructions to cause the one or more processors determine an overlay error between one of the first exposure structure and the second exposure structure of the sample based on the time-varying interference signals, where the time-varying interference signals corresponding to the non-overlapping first exposure structure and second exposure structure are synchronized.

A method is disclosed, in accordance with one or more embodiments of the present disclosure. In embodiments, the method includes receiving time-varying interference signals from two or more photodetectors associated with a first exposure structure and a second exposure structure in one or more cells as an overlay target is scanned in accordance with a metrology recipe, where the first exposure structure and the second exposure structure form a side-by-side grating, where the side-by-side grating includes one or more diffraction gratings, where at least one diffraction grating is a non-overlapping side-by-side grating, where the first exposure structure is arranged adjacent to the second exposure structure, where the side-by-side grating is periodic along the scan direction. In embodiments, the method includes determining an overlay error between one of the first exposure structure and the second exposure structure of the sample based on the time-varying interference signals, where the time-varying interference signals corresponding to the non-overlapping first exposure structure and second exposure structure are synchronized.

An overlay metrology target is disclosed, in accordance with one or more embodiments of the present disclosure. In embodiments, the overlay metrology target includes one or more cells having a side-by-side grating. In embodiments, the side-by-side grating includes one or more diffraction gratings arranged on two or more layers of the sample. In embodiments, the two or more layers of the sample include at least a first layer and a second layer. In embodiments, the first layer includes a first exposure structure and the second layer includes a second exposure structure. In embodiments, the first exposure structure and the second exposure structure form a non-overlapping side-by-side grating, where the first exposure structure is arranged adjacent to the second exposure structure, and where the side-by-side grating is periodic along the scan direction.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
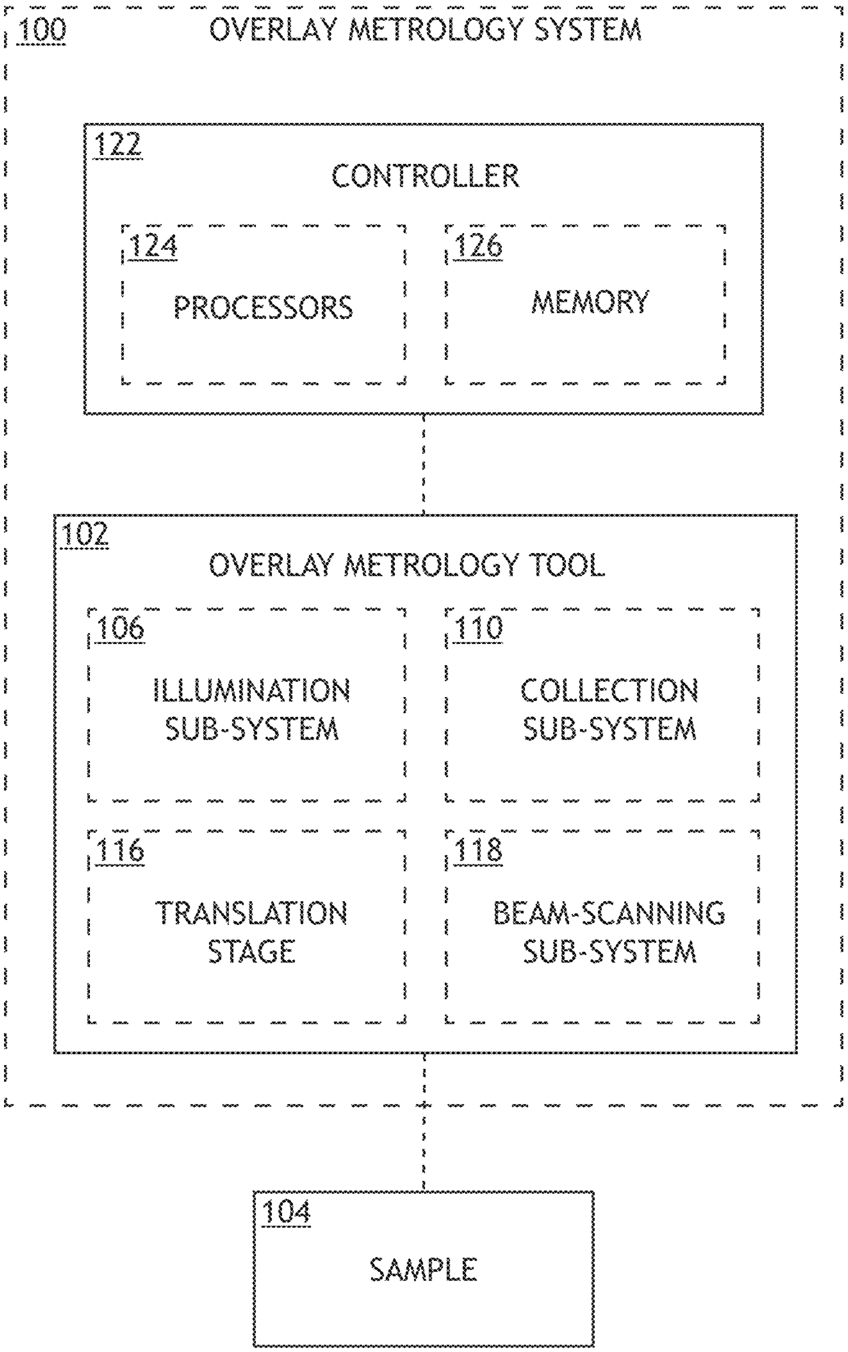
FIG. 1A is a conceptual view of a system for performing scatterometry overlay metrology on overlay targets using pupil manipulations, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to scanning scatterometry overlay using overlay targets including side-by-side gratings, where the side-by-side gratings includes two or more diffraction gratings arranged side-by-side. In some embodiments, the constituent gratings are arranged orthogonal to a scan direction. In some embodiments, the constituent gratings are arranged along the scan direction.

For the purposes of the present disclosure, the term “scatterometry metrology” is used to broadly encompass the terms “scatterometry-based metrology” and “diffraction-based metrology” in which a sample having periodic features on one or more sample layers is illuminated with an illumination beam having a limited angular extent and one or more distinct diffraction orders are collected for the measurement. Further, the term "scanning metrology" is used to describe metrology measurements generated when a sample is in motion relative to illumination used for a measurement. In a general sense, scanning metrology may be implemented by moving the sample, the illumination, or both.

Embodiments of the present disclosure are directed to systems and methods for scanning overlay metrology based on time-varying interference signals from side-by-side gratings in a collection pupil plane. It is contemplated herein that measurement conditions leading to overlapping diffraction orders of a side-by-side grating may lead to interference. Such interference signals may include information associated with asymmetries in the target structure such as, but not limited to, overlay between the gratings, and the like. It is further contemplated herein that scanning the side-by-side grating relative to an illumination beam (or vice versa) may provide characterization of the position-dependent overlay of the side-by-side grating and may thus enable the determination of asymmetries such as, but not limited to, overlay.

Some embodiments of the present disclosure are directed to scanning scatterometry overlay metrology based on time-varying interference signals associated with overlapping diffraction lobes from gratings of a side-by-side grating. For instance, scanning-based scatterometry measurement techniques may include fast detectors to capture time-varying interference signals generated as the sample is scanned. The detectors may be placed in the pupil plane at locations of overlap between selected diffraction orders to capture time-varying interference signals as the sample is scanned. Various non-limiting scanning scatterometry overlay metrology techniques are described in U.S. Pat. No. 11,300,405 issued on Apr. 12, 2022; U.S. Pat. No. 11,378,394, issued on Jul. 5, 2022; U.S. patent application Ser. No. 17/708,958, filed on Mar. 30, 2022; U.S. patent application Ser. No. 17/709,200, filed on Mar. 30, 2022; U.S. Patent Publication No. 2023/0213875, published on Jul. 6, 2023; U.S. patent application Ser. No. 18/099,798, filed on Jan. 20, 2023; and U.S. patent application Ser. No. 18/110,746, filed on Feb. 16, 2023, which are all incorporated herein by reference in their entireties. It is contemplated herein that the systems and methods of the above incorporated references may be extended or otherwise adapted to provide overlay measurements of side-by-side gratings.

In some embodiments, an overlay metrology system includes photodetectors located in a pupil plane at positions corresponding to diffraction lobes from side-by-side gratings. For example, photodetectors may be located at locations of overlap between first-order diffraction lobes and one of 0-order diffraction (e.g., specular reflection) or a portion of illumination split from the generated beam (e.g., split into primary illumination and auxiliary illumination) prior to incidence. It is contemplated herein that these combined diffraction orders will exhibit time-varying interference signals (e.g., AC signals) during a scanning measurement, which may be captured using the photodetectors. For example, the properties of the side-by-side gratings (e.g., pitches of the constituent gratings) and/or the measurement conditions (e.g., illumination wavelength, illumination incidence angle, collection angle, or the like) may be selected to provide that positive and negative diffraction orders associated with combined diffraction by the gratings of the side-by-side grating are collected by the system and captured by the photodetectors.

Some embodiments of the present disclosure are directed to providing recipes for configuring an overlay metrology tool. An overlay metrology tool is typically configurable according to a recipe including a set of parameters for controlling various aspects of an overlay measurement such as, but not limited to, the illumination of a sample, the collection of light from the sample, or the position of the sample during a measurement. In this way, the overlay metrology tool may be configured to provide a selected type of measurement for one or more overlay target designs of interest. For example, a metrology recipe may include illumination parameters such as, but not limited to, a number of illumination beams, an illumination wavelength, an illumination pupil distribution (e.g., a distribution of illumination angles and associated intensities of illumination at those angles), a polarization of incident illumination, or a spatial distribution of illumination. By way of another example, a metrology recipe may include collection parameters such as, but not limited to, a collection pupil distribution (e.g., a desired distribution of angular light from the sample to be used for a measurement and associated filtered intensities at those angles), collection field stop settings to select portions of the sample of interest, polarization of collected light, wavelength filters, positions of one or more detectors (e.g., photodetectors) or parameters for controlling the one or more detectors. By way of a further example, a metrology recipe may include various parameters associated with the sample position during a measurement such as, but not limited to, a sample height, a sample orientation, whether a sample is static during a measurement, or whether a sample is in motion during a measurement (along with associated parameters describing the speed, scan pattern, or the like).

In some embodiments, the properties of the side-by-side gratings (e.g., pitches of the constituent gratings, or the like) and the measurement conditions (e.g., illumination wavelength, illumination incidence angle, collection angle, or the like) are arranged or otherwise selected (e.g., using a metrology recipe) to provide a selected distribution of diffraction and/or combined diffraction orders and to further provide that photodetectors are placed at suitable locations to capture these orders to generate time-varying interference signals of interest.

It is further contemplated herein that the systems and methods disclosed herein may provide sensitive overlay metrology at a high throughput. For example, the non-imaging configuration enables the use of fast photodetectors suitable for fast scan speeds. As a non-limiting example, photodetectors having a bandwidth of 1 GHz may enable scan speeds of approximately 10 centimeters per second on targets having a pitch of 1 micrometer.

The side-by-side gratings may generally be formed as portions of overlay targets and may generally be located anywhere on the sample. Further, overlay targets may include one or more measurement cells, where each cell includes at least one diffraction grating that is not stacked (i.e., not overlapping). An overlay measurement may then be based on any combination of measurements of the various cells of the overlay target. For example, multiple cells of an overlay target may be designed with different intended offsets (e.g., gratings in the various layers of the sample that are intentionally misaligned with known offset values), which may improve the accuracy and/or sensitivity of the measurement.

It is contemplated herein that scatterometry overlay metrology as disclosed herein may provide numerous benefits. For example, the system and method disclosed herein may utilize multi-layer overlay targets including non-stacked gratings. By way of another example, overlay measurements may be determined in a single metrology measurement, where one or more layers of the metrology target are not stacked. Further, the gratings of the multi-layer overlay target may simultaneously interact with one or more illumination beams when the target is scanned. In this regard, the simultaneous scanning may enable measuring multi-layer overlay in a single scan. Alternatively, the gratings of the multi-layer overlay target may sequentially interact with one or more illumination beams when the target is scanned. In this regard, a region of interest may be used during phase extraction to ensure that the gratings start at the same location. By way of another example, the system and method disclosed herein may enable side-by-side overlay targets (e.g., Moiré, AIM, etc.) where printing different pitches stacked on top of each other is not allowed due to design rules. Further, the system and method disclosed herein may overcome difficulties in measuring each layer in its ideal condition since the laser scanning method performance is not strongly dependent on the wavelength of light used. In this regard, a broader wavelength range may be used. Additionally, where the overlay target includes side-by-side gratings with identical pitches, the target may reduce tool-induced shift errors. Further, the system and method disclosed herein may improve target accuracy by allowing measurement of extremely small printed targets that are closer to the size of the actual device. The system and method disclosed herein may further not be impacted by symmetric process variation and amplitude asymmetries induced by asymmetric process variations.

Referring now to FIGS. 1A-7, systems and methods for determining overlay measurements of a scanning target, are described in greater detail in accordance with one or more embodiments of the present disclosure.

FIG. 1A is a conceptual view of an overlay metrology system 100 for performing scatterometry overlay metrology on a side-by-side grating metrology target, in accordance with one or more embodiments of the present disclosure.

In embodiments, the overlay metrology system 100 includes an overlay metrology tool 102 to perform scatterometry overlay measurements of a sample 104. For example, the overlay metrology tool 102 may perform scatterometry overlay measurements on portions of the sample 104 having side-by-side gratings.

Figure 1B:
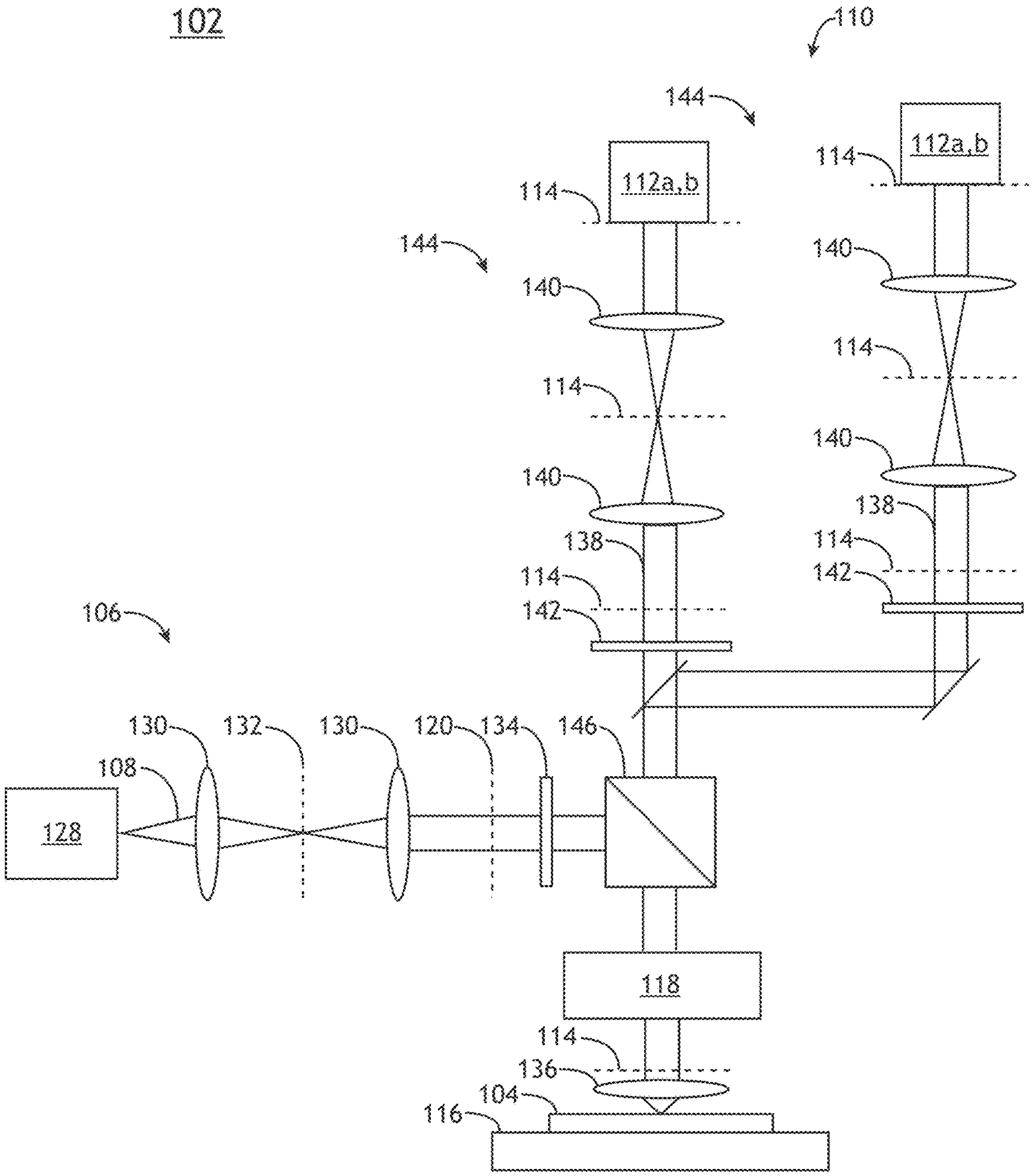
FIG. 1B is a schematic view of the overlay metrology tool, in accordance with one or more embodiments of the present disclosure.

FIG. 1B is a schematic view of the overlay metrology tool 102, in accordance with one or more embodiments of the present disclosure.

In embodiments, the overlay metrology tool 102 includes an illumination sub-system 106 to generate illumination in the form of one or more illumination beams 108 to illuminate the sample 104 and a collection sub-system 110 to collect light from the illuminated sample 104. For example, the one or more illumination beams 108 may be angularly limited on the sample 104 such that side-by-side gratings (e.g., in one or more cells of an overlay target) may generate discrete diffraction orders. Further, the one or more illumination beams 108 may be spatially limited such that they may illuminate selected portions of the sample 104. For instance, each of the one or more illumination beams 108 may be spatially limited to illuminate a particular cell of an overlay target. In some embodiments, the one or more illumination beams 108 underfill a particular cell of an overlay target.

The collection sub-system 110 may then collect at least some diffraction orders associated with diffraction of the illumination beam 108 from a side-by-side grating. In embodiments, the collection sub-system 110 may include at least two photodetectors 112 positioned in a collection pupil plane 114 at locations associated with time-varying interference signals indicative of overlay. For example, as will be described in greater detail below, suitable locations for the photodetectors 112 may include, but are not limited to, locations associated with positive and negative diffraction orders or locations associated with overlap between diffraction orders of the constituent gratings of a side-by-side grating (e.g., an overlap region between first-order diffraction of each grating and 0-order diffraction). In embodiments, the collection sub-system 110 may include an area sensor positioned in a collection pupil plane 114 at a location associate with time-varying interference signals indicative of overlay.

In embodiments, the overlay metrology tool 102 includes a translation stage 116 to scan the sample 104 through a measurement field of view of the overlay metrology tool 102 during a measurement to implement scanning metrology.

In embodiments, the overlay metrology tool 102 includes a beam-scanning sub-system 118 configured to modify or otherwise control a position of at least one illumination beam 108 on the sample 104. For example, the beam-scanning sub-system 118 may scan an illumination beam 108 in a direction orthogonal to a scan direction (e.g., a direction in which the translation stage 116 scans the sample 104) during a measurement.

Referring now to FIGS. 2A-3D, the collection of diffraction orders from side-by-side gratings and the placement of the photodetectors 112 for scanning scatterometry overlay metrology is described in greater detail, in accordance with one or more embodiments of the present disclosure.

Figure 2A:
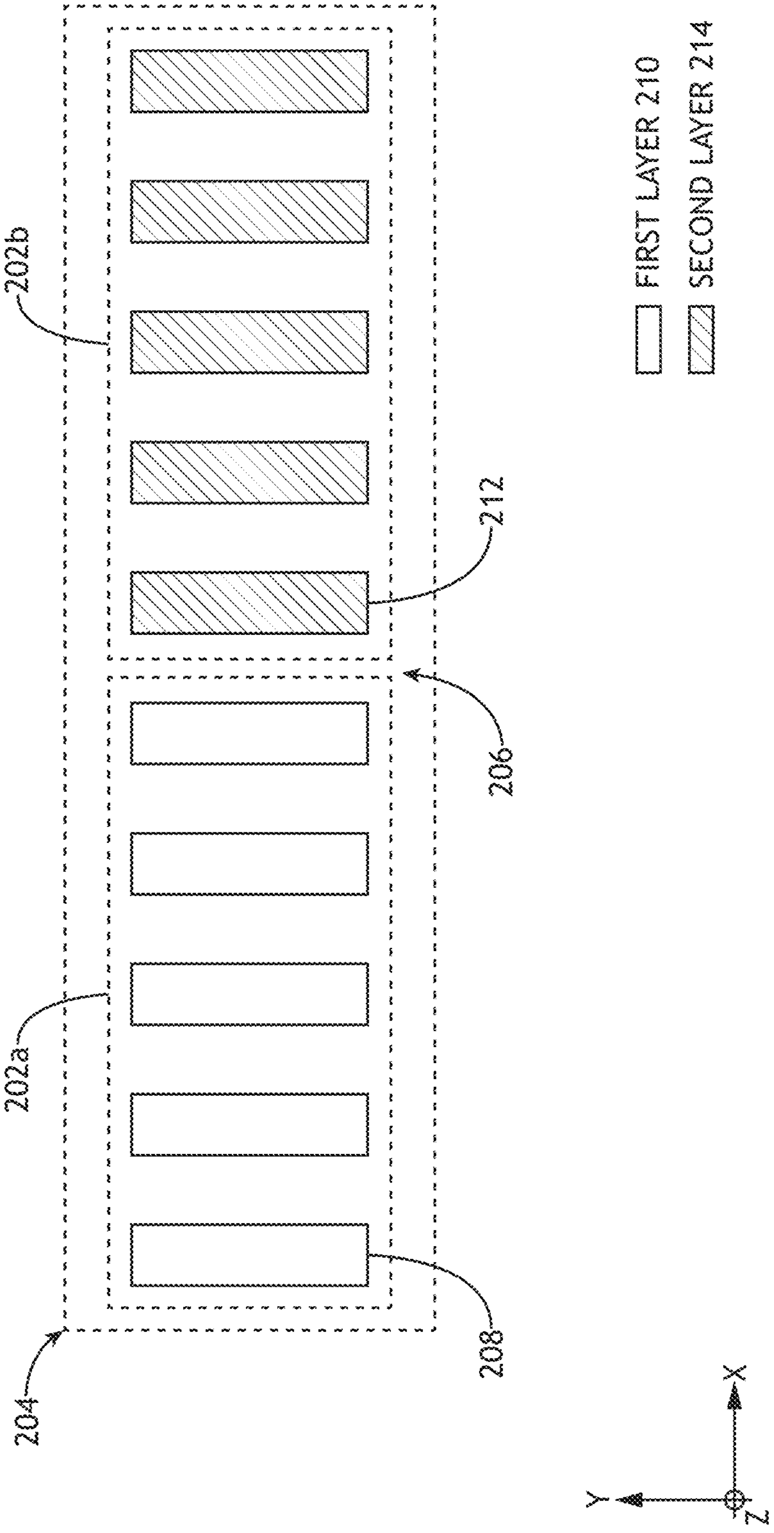
FIG. 2A is a schematic view of a cell of an overlay target on a sample, in accordance with one or more embodiments of the present disclosure.
Figure 2B:
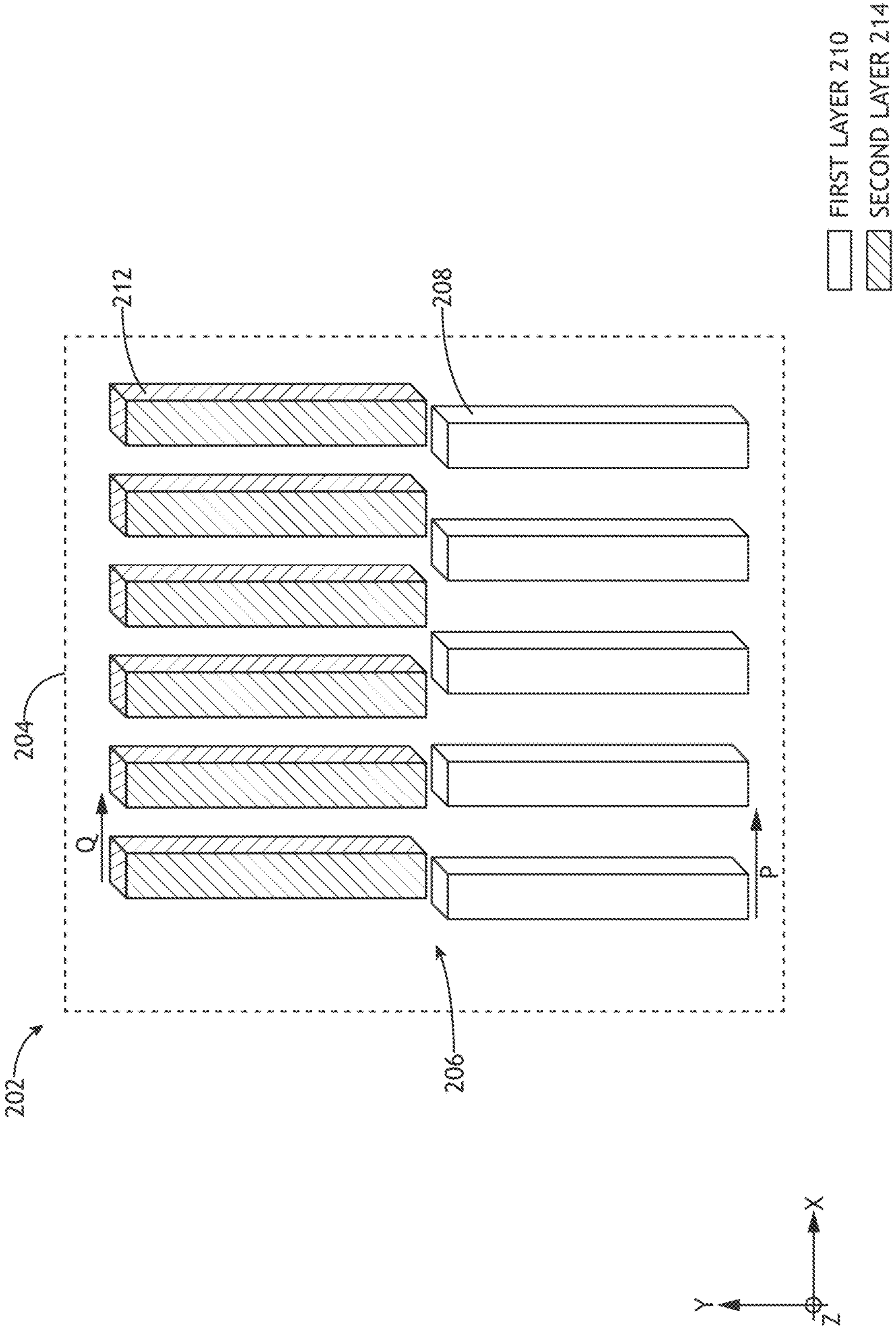
FIG. 2B is a schematic view of a cell of an overlay target on a sample, in accordance with one or more embodiments of the present disclosure.
Figure 2C:
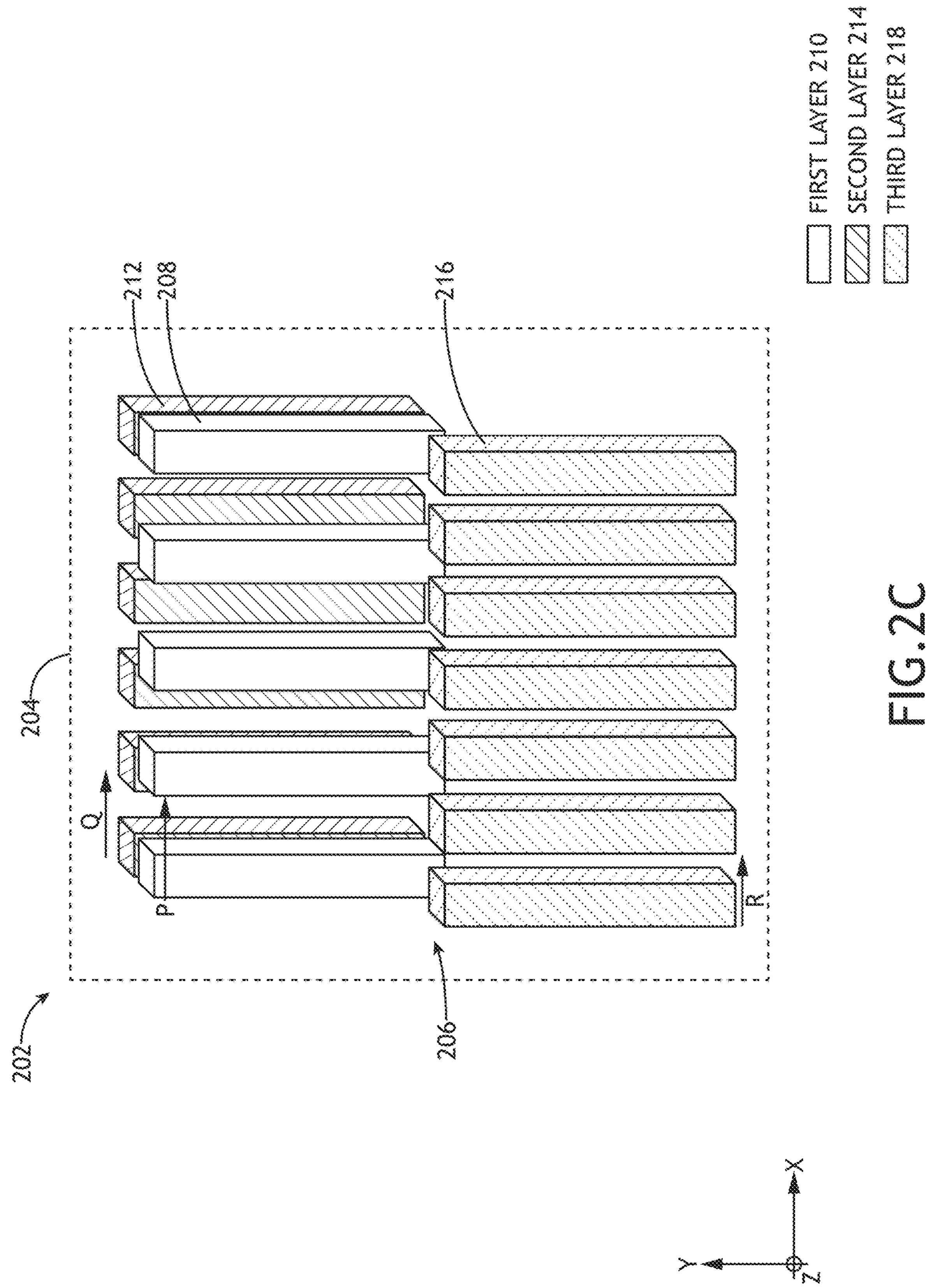
FIG. 2C is a schematic view of a cell of an overlay target on a sample, in accordance with one or more embodiments of the present disclosure.

FIGS. 2A-2C are schematic views of one or more cells 202, in accordance with one or more embodiments of the present disclosure.

Referring generally to FIGS. 2A-2C, in embodiments, the overlay target 204 includes one or more cells 202, where any particular cell 202 of the one or more cells 202 may include a side-by-side grating 206 with a periodicity along any direction. For example, as shown in FIG. 2A, the overlay target 204 may include a plurality of cells 202, where the different cells 202 have different configurations of the periodicities of the associated gratings. For instance, the overlay target 204 may include a first cell **202*a* including a first exposure structure 208 and a second cell 202*b* including a second exposure structure 212 having periodicity along a common direction, where the combination of the first and second gratings may be referred to as a side-by-side grating 206. By way of another example, as shown in FIGS. 2B-2C, the overlay target 204 may include a single cell 202 with a side-by-side grating 206** having periodicity along a common direction.

In embodiments, the side-by-side grating 206 includes one or more diffraction gratings, where at least one diffraction grating in the side-by-side grating 206 is not stacked.

Referring to FIG. 2A, for example, the side-by-side grating 206 may include a first exposure structure 208 located on a first layer 210 of the sample and a second exposure structure 212 located on a second layer 214 of the sample 104, where the first exposure structure 208 and the second exposure structure 212 are arranged along the scan direction. For instance, the second exposure structure 212 may be arranged adjacent to the first exposure structure 208, such that the first exposure structure 208 does not overlap with the second exposure structure 212. The first exposure structure 208 may be associated with a first lithographic exposure and the second exposure structure 212 may be associated with a second lithographic exposure, where the first and second lithographic exposure may be on the same layer (as shown in FIG. 2A) or different layers).

Referring to FIG. 2B, for example, the side-by-side grating 206 may include a first exposure structure 208 located on a first layer 210 of the sample 104 and second exposure structure 212 located on a second layer 214 of the sample 104, where the first exposure structure 208 and the second exposure structure 212 are arranged orthogonal to the scan direction. For instance, the second exposure structure 212 may be arranged below the first exposure structure 208, such the first exposure structure 208 is not stacked on top of the second exposure structure 212.

It is contemplated that the side-by-side grating 206 may include a stacked grating, so long as there is at least one grating that is non-overlapping (or not stacked). Referring to FIG. 2C, for example, the side-by-side grating 206 may include a first exposure structure 208 located on a first layer 210 of the sample 104, a second exposure structure 212 located on a second layer 214 of the sample 104, and a third exposure structure 216 located on a third layer 218 of the sample, where the first exposure structure 208, the second exposure structure 212, and the third exposure structure 216 are arranged orthogonal to the scan direction. For instance, the first exposure structure 208 and the second exposure structure 212 may be stacked (i.e., may overlap), while at least the first exposure structure 208 and the second exposure structure 212 are not stacked on top of the third exposure structure 216.

In embodiments, the gratings of the side-by-side grating 206 may have identical pitches. For example, the first exposure structure 208 and the second exposure structure 212 may have identical pitches. It is contemplated that where the side-by-side grating 206 has identical pitches, the tool-induced-shift (TIS) errors may be reduced (as shown in FIG. 2A for example).

In embodiments, the gratings of the side-by-side grating 206 may have different pitches. For example, the first exposure structure 208 and the second exposure structure 212 may have different pitches. For instance, FIG. 2B illustrates the pitches of the first exposure structure 208 and the second exposure structure 212 as P and Q, respectively. By way of another example, the first exposure structure 208, the second exposure structure 212, and the third-layer grating 216 may have different pitches. For instance, FIG. 2C illustrates the pitches of the first exposure structure 208, the second exposure structure 212, and third-layer grating 216, as P, Q, R, respectively.

It is noted that the configurations depicted in FIGS. 2A-2C are provided merely for illustrative purposes and shall not be construed as limiting the scope of the present disclosure. As such, the side-by-side grating 206 may be formed of any number of layers with any variety of pitches. Further, the overlay target 204 may include any number of cells 202 suitable for measurement. Additionally, the cells 202 may be distributed in any pattern or arrangement. In embodiments, the overlay target 204 includes one or more cell groupings distributed along a scanning direction (e.g., a direction of motion of the sample 104), where cells 202 within each particular cell grouping are oriented to have side-by-side gratings 206 with periodicity along a common direction. In this way, all cells 202 within a particular cell grouping may be imaged at the same time while the sample 104 is scanned through a measurement field of view of the collection sub-system 110.

Referring now to FIGS. 3A-3D, various non-limiting configurations for the generation and measurement of time-varying interference signals from a side-by-side grating 206 in one or more cells 202 of an overlay target 204 are described in accordance with one or more embodiments of the present disclosure.

Figure 3A:
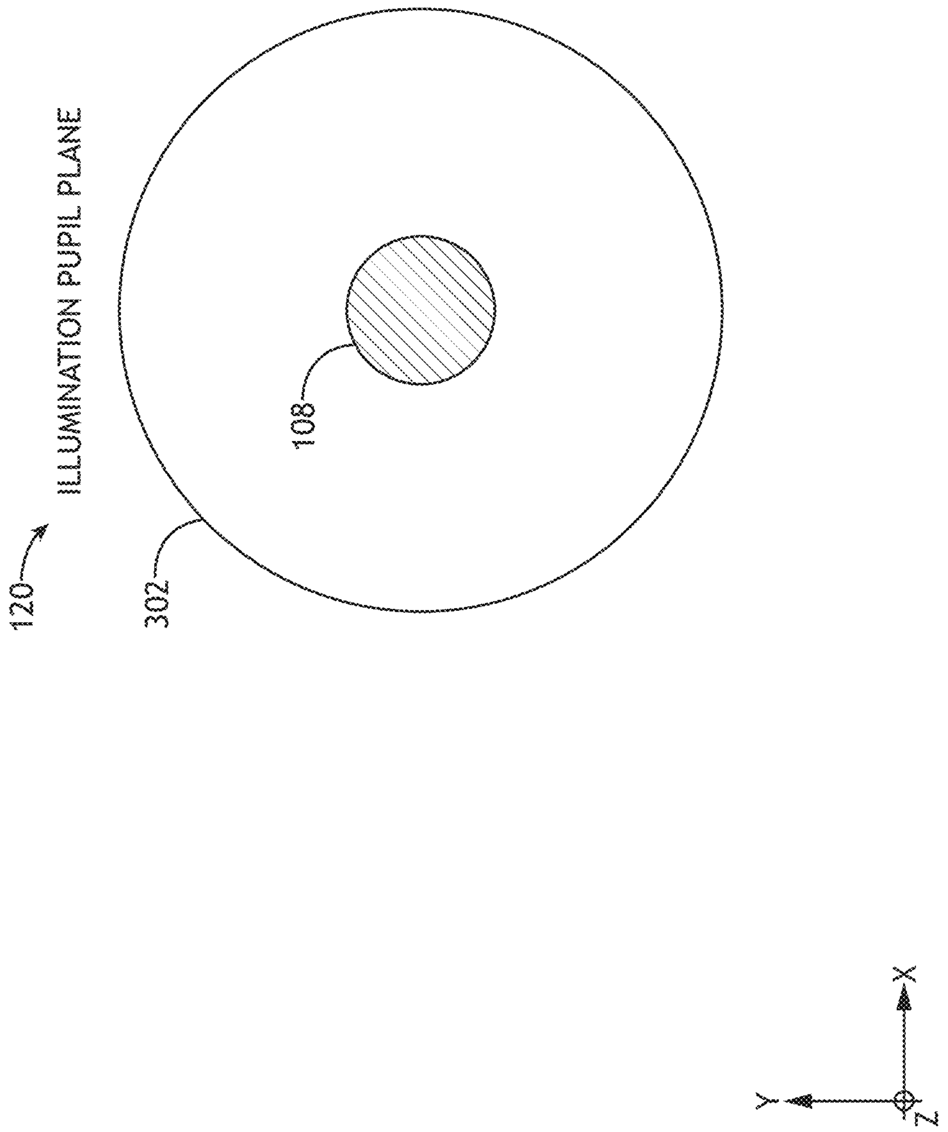
FIG. 3A is a top view of an illumination pupil in an illumination pupil plane of the overlay metrology tool, in accordance with one or more embodiments of the present disclosure.

FIG. 3A is a top view of an illumination pupil 302 in an illumination pupil plane 120 of the overlay metrology tool 102, in accordance with one or more embodiments of the present disclosure. For example, the illumination pupil plane 120 may correspond to a pupil plane in the illumination sub-system 106 as illustrated in FIG. 1B. In embodiments, the illumination sub-system 106 illuminates the overlay target 204 with one or more illumination beams 108 at normal incidence (or near-normal incidence) as illustrated in FIG. 3A. Further, the one or more illumination beams 108 may illuminate the overlay target 204 with a limited range of incidence angles as illustrated by the limited size in the collection pupil plane 114. In this regard, the overlay target 204 may diffract the one or more illumination beams 108 into discrete diffraction orders.

Figure 3B:
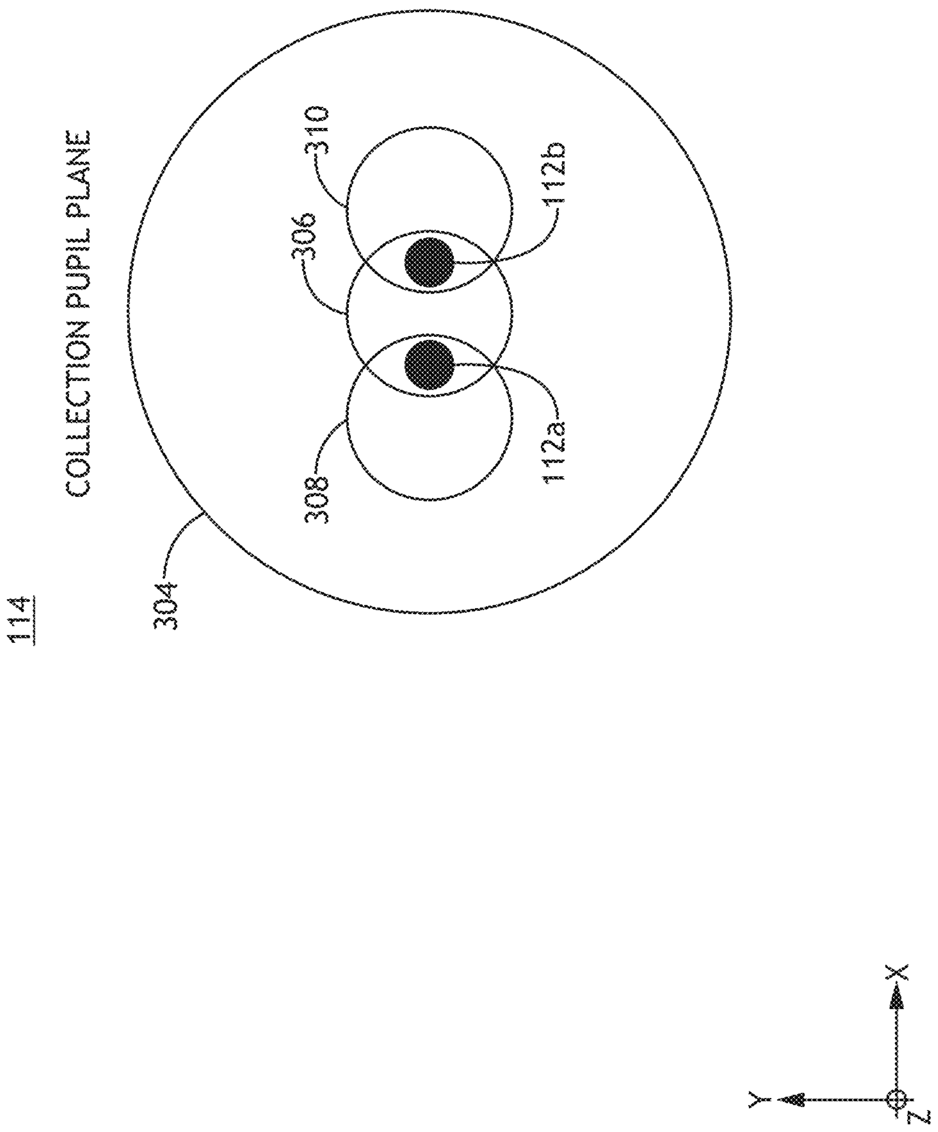
FIG. 3B is a top view of a collection pupil in the collection pupil plane of the overlay metrology tool including grating diffraction lobes associated with the overlay target shown in FIG. 2A, in accordance with one or more embodiments of the present disclosure.
Figure 3C:
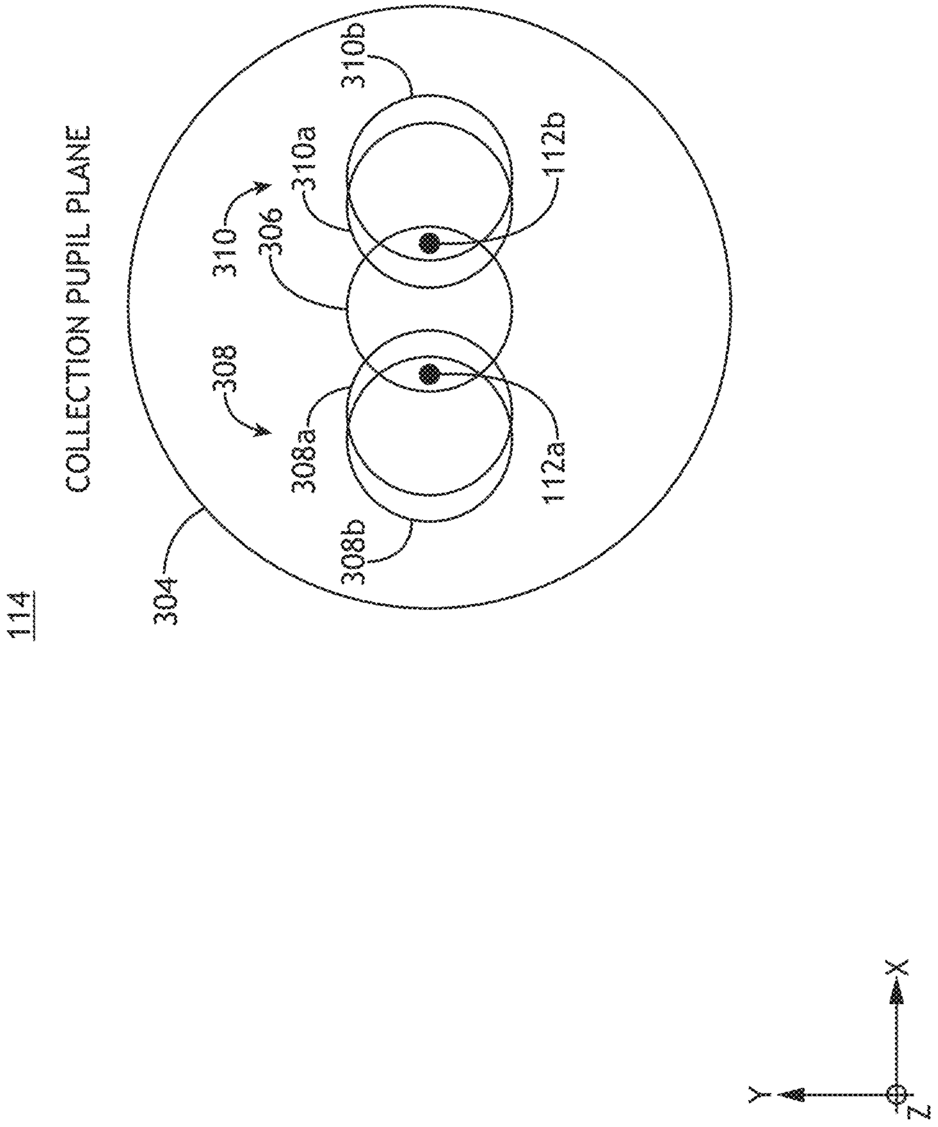
FIG. 3C is a top view of a collection pupil in the collection pupil plane of the overlay metrology tool including grating diffraction lobes associated with the overlay target shown in FIG. 2B, in accordance with one or more embodiments of the present disclosure.
Figure 3D:
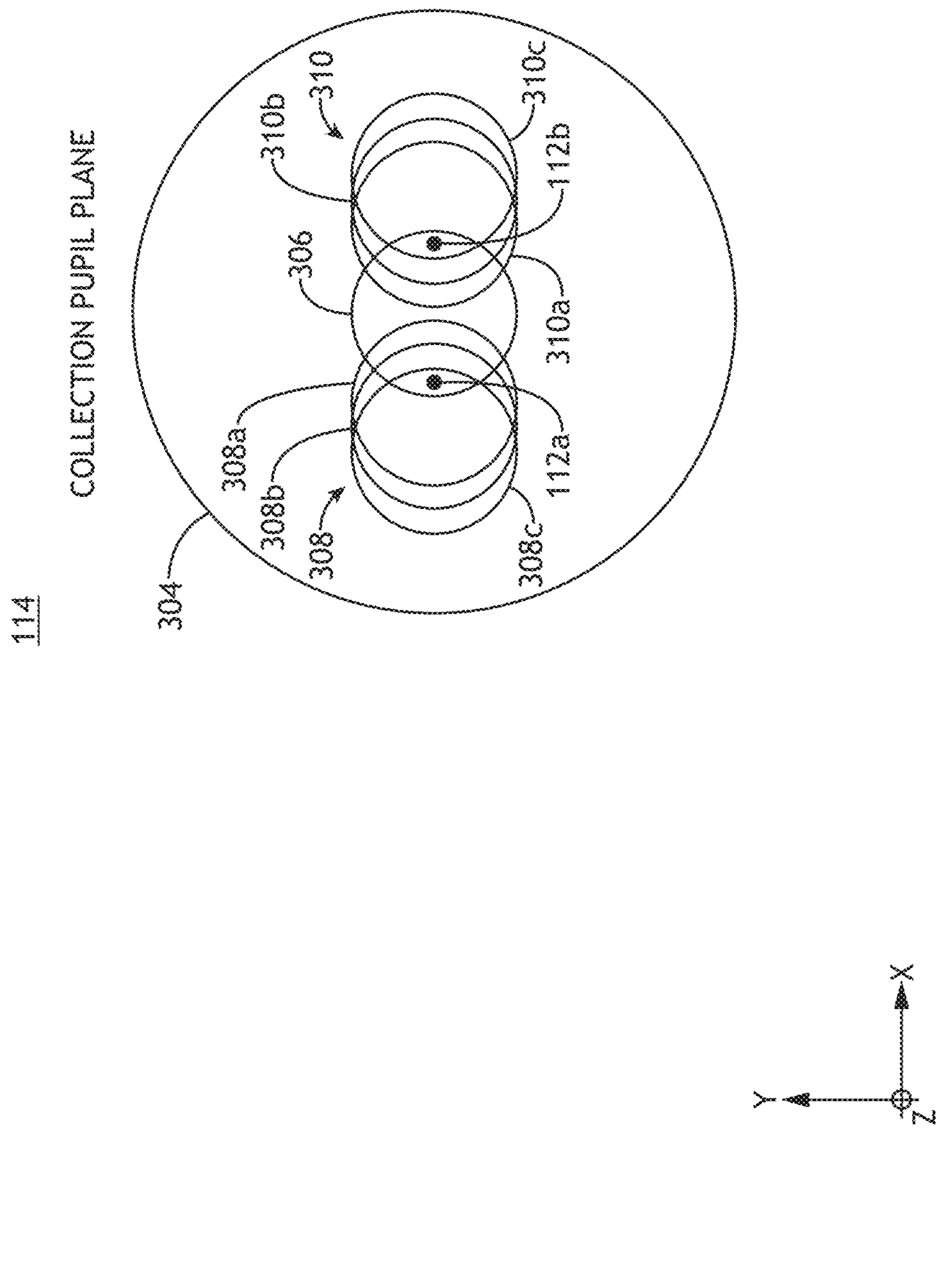
FIG. 3D is a top view of a collection pupil in the collection pupil plane of the overlay metrology tool including grating diffraction lobes associated with the overlay target shown in FIG. 2C, in accordance with one or more embodiments of the present disclosure.

FIGS. 3B-3D illustrate non-limiting configurations for capturing time-varying interference signals from an overlay target 204 with a side-by-side grating 206 in a scanning configuration.

FIG. 3B illustrates a non-limiting configuration of diffraction orders of the illumination beam 108, associated with the overlay metrology target shown in FIG. 2A, in a collection pupil plane 114 and associated positions of photodetectors 112 suitable for capturing time-varying interference signals from which an overlay measurement may be extracted. In particular, FIG. 3B illustrates 0-order diffraction 306, −1 order grating diffraction 308, and +1 order grating diffraction 310 distributed along the direction of periodicity of the overlay target 204 (e.g., the X direction here) in the collection pupil plane 114. For example, the −1 order grating diffraction 308 and the +1 order grating diffraction 310 may be associated with grating diffraction from the first exposure structure 208 or the second exposure structure 212, where the diffraction angles are based on the pitches of the gratings and illumination wavelength. In this regard, the first-order diffraction lobes 308, 310 of the first exposure structure 208 and the second exposure structure 21 may overlap with the 0-order diffraction lobe, as shown in FIG. 4B.

FIG. 3C illustrates a non-limiting configuration of diffraction orders of the illumination beam 108, associated with the overlay metrology target shown in FIG. 2B, in a collection pupil plane 114 and associated positions of photodetectors 112 suitable for capturing time-varying interference signals from which an overlay measurement may be extracted. In particular, FIG. 3C illustrates 0-order diffraction 306, −1 order grating diffraction 308, and +1 order grating diffraction 310 distributed along the direction of periodicity of the side-by-side grating 206 (e.g., the X direction here) in the collection pupil plane 114. For example, the −1 order grating diffraction 308*a* and the +1 order grating diffraction 310*a* may be associated with grating diffraction from first exposure structure 208 and the −1 order grating diffraction 308*b* and the +1 order grating diffraction 310*b* may be associated with grating diffraction from second exposure structure 212, where the diffraction angles are based on the pitches of the gratings and illumination wavelength. In this regard, the respective diffraction lobes of the +1 order grating diffraction 308*a,b* from the respective layers 210, 214 may overlap and the −1 order grating diffraction 310*a,b* from the respective layers 210, 214 may overlap, where the first-order grating diffraction from each overlaps with the 0-order grating diffraction.

FIG. 3D illustrates a non-limiting configuration of diffraction orders of the illumination beam 108, associated with the overlay metrology target shown in FIG. 2C, in a collection pupil plane 114 and associated positions of photodetectors 112 suitable for capturing time-varying interference signals from which an overlay measurement may be extracted. In particular, FIG. 3D illustrates 0-order diffraction 306, −1 order grating diffraction 308, and +1 order grating diffraction 310 distributed along the direction of periodicity of the side-by-side grating 206 (e.g., the X direction here) in the collection pupil plane 114. For example, the −1 order grating diffraction 308*a* and the +1 order grating diffraction 310*a* may be associated with grating diffraction from first exposure structure 208, the −1 order grating diffraction 308*b* and the +1 order grating diffraction 310*b* may be associated with grating diffraction from second exposure structure 212, and the −1 order grating diffraction 308*b* and the +1 order grating diffraction 310*b* may be associated with grating diffraction from third exposure structure 216, where the diffraction angles are based on the pitches of the gratings and illumination wavelength. In this regard, the respective diffraction lobes of the +1 order grating diffraction 308*a-c* from the respective layers 210, 214, 216 may overlap and the −1 order grating diffraction 310*a-c* from the respective layers 210, 214, 216 may overlap, where the first-order grating diffraction from each overlaps with the 0-order grating diffraction.

It is contemplated herein that photodetectors 112 placed at locations in the collection pupil plane 114 associated with diffraction lobes (e.g., areas at which first-order diffraction lobes may overlap with 0-order diffraction lobes) may capture time-varying interference signals indicative of overlay. It is further contemplated herein that time-varying interference signals associated with diffraction lobes may be captured by a photodetector 112 when each of the relevant diffraction lobes (e.g., areas at which first-order diffraction lobes may overlap with 0-order diffraction lobes) are incident on the photodetector 112 (e.g., are within a measurement area of the photodetector 112). In this way, the relevant diffraction lobes need not necessarily overlap in the collection pupil plane 114 but rather may overlap on the photodetector 112.

It is recognized herein that the distribution of diffracted orders of an illumination beam 108 by a periodic structure such as a side-by-side grating 206 may be influenced by a variety of parameters such as, but not limited to, a wavelength of the illumination beam 108, an incidence angle of the illumination beam 108 in both altitude and azimuth directions, pitches of the gratings of the side-by-side grating 206, or a numerical aperture (NA) of a collection lens. Accordingly, in embodiments of the present disclosure, the illumination sub-system 106, the collection sub-system 110, and the overlay target 204 may be configured (e.g., according to a metrology recipe defining a selected set of associated parameters) to provide a desired distribution of diffraction orders in a collection pupil plane 114 suitable for generating time-varying interference patterns indicative of overlay. For example, the illumination sub-system 106 and/or the collection sub-system 110 may be configured to generate measurements on side-by-side gratings having selected range of periodicities to provide a desired distribution in the collection pupil plane 114. Further, various components of the illumination sub-system 106 and/or the collection sub-system 110 (e.g., stops, pupils, or the like) may be adjustable to provide the desired distribution in the collection pupil plane 114.

It is to be understood, however, that the particular configuration illustrated in FIG. 3B and the associated description is not limiting. In particular, it is contemplated herein that the time-varying interference signals may be captured using various metrology overlay techniques, as generally discussed in U.S. Pat. No. 11,300,405 issued on Apr. 12, 2022; U.S. Pat. No. 11,378,394, issued on Jul. 5, 2022; U.S. patent application Ser. No. 17/708,958, filed on Mar. 30, 2022; U.S. patent application Ser. No. 17/709,200, filed Mar. 30, 2022; U.S. patent application Ser. No. 17/709,104, filed on Mar. 30, 2022; U.S. patent application Ser. No. 18/099,798, filed Jan. 20, 2023; and U.S. patent application Ser. No. 18/110,746, filed on Feb. 16, 2023.

For example, Moiré diffraction lobes may overlap with 0-order diffraction in the collection pupil plane (e.g., as provided by a metrology recipe). In this example, a first photodetector may located at a region of overlap between the −1 order Moiré diffraction and the 0-order diffraction and a second photodetector may be located at a region of overlap between the +1 order Moiré diffraction and the 0-order diffraction, where each of the photodetectors 112 may then capture a time-varying interference signal as the sample 104 is scanned. Additionally, an overlay measurement may determined based on time-varying signals associated with only the first-order Moiré diffraction lobes (e.g., without reference to 0-order diffraction). By way of another example, the first-order diffraction from the first exposure structure 208 and the second exposure structure 212 overlap in the collection pupil 304. For instance, a first photodetector may be located in a first overlap region between −1 order diffraction from the first exposure structure 208 ($-1_{TOP}$) and −1 order diffraction from the second exposure structure 212 ($-1_{BOTTOM}$), and a second photodetector may be located in a second overlap region between +1 order diffraction from the first exposure structure 208 ($+1_{TOP}$) and +1 order diffraction from the second exposure structure 212 ($+1_{BOTTOM}$). By way of another example, an overlay measurement may be determined based on time-varying signals associated with the first-order grating diffraction lobes (e.g., without reference to 0-order diffraction 306) and second-order diffraction lobes. Further, the first-order diffraction lobes need not necessarily overlap in the collection pupil plane, but may overlap on the respective photodetectors 112*a,b* in some embodiments. Additionally, in some embodiments, an overlay measurement is determined based on time-varying signals associated with only the first-order grating diffraction lobes (e.g., without reference to 0-order diffraction 306). For example, an overlay measurement may be determined based on time-varying signals associated with overlap between auxiliary illumination (e.g., illumination split from the generated illumination beam) and first order diffraction lobes, as generally discussed in U.S. patent application Ser. No. 18/110,746, filed on Feb. 16, 2023, which is incorporated herein by reference in the entirety.

It is further contemplated, as described previously herein, the 0-order diffraction 306 need not necessarily overlap with the −1 order grating diffraction 308 and the +1 order grating diffraction 310 in the collection pupil 304 as illustrated in FIGS. 3B-3D. Rather, in some embodiments, these diffraction lobes are sufficiently close together that the 0-order diffraction 306 overlaps with the −1 order grating diffraction 308 on a first photodetector 112*a* and the 0-order diffraction 306 overlaps with the +1 order grating diffraction 310 on a second photodetector 112*b*.

Referring generally to FIGS. 3B-3D, it is contemplated herein that the phase of each of the grating diffraction orders (e.g., the first-order diffraction 308,310) may oscillate during a scan to form time-varying interference signals and overlay may be determined based on these oscillations. As a result, an overlay measurement may be performed by capturing and comparing these time-varying interference patterns. For example, the phase differences of the −1 order and +1 order grating diffraction 308, 310 from each individual grating of the one or more exposures may be used to measure the position of the grating relative to the optical system, as will be discussed further herein.

Figure 4A:
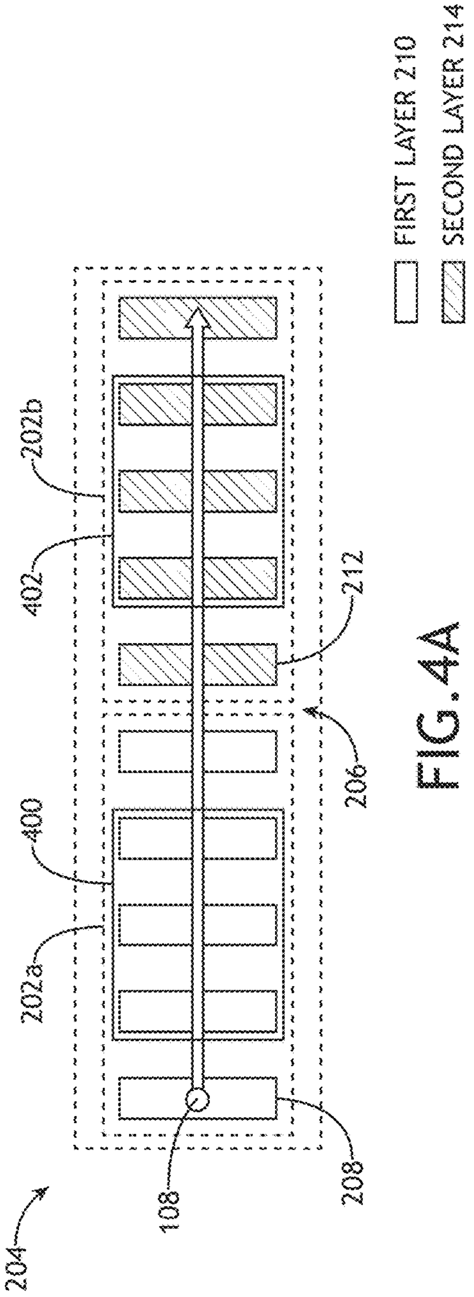
FIG. 4A is a schematic view of an illumination beam spot on the overlay target shown in FIG. 2A, in accordance with one or more embodiments of the present disclosure.
Figure 4B:
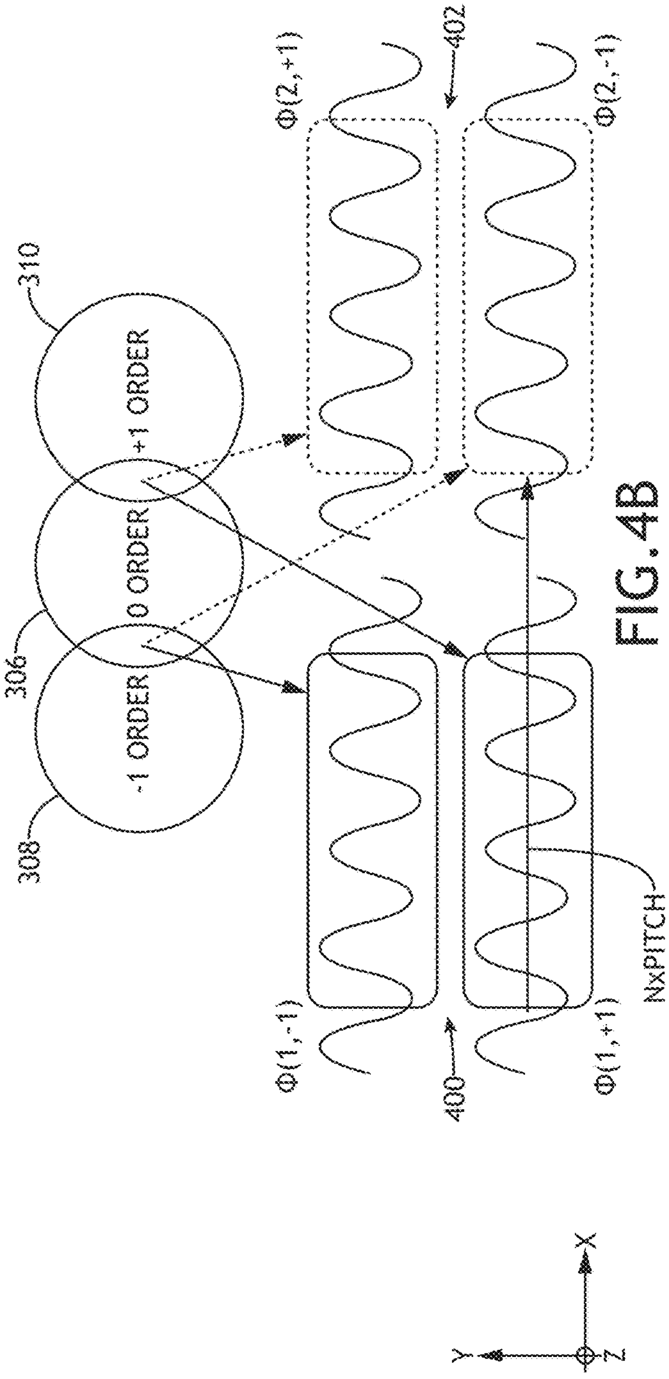
FIG. 4B is a top view grating diffraction lobes associated with the overlay target shown in FIG. 2A along with associated phase extraction information from the overlay target, in accordance with one or more embodiments of the present disclosure.

Referring generally to FIGS. 4A-6C, in embodiments, the overlay metrology target 204 is scanned by the one or more illumination beams 108 of the illumination sub-system 106. Referring to FIG. 4A, the overlay metrology target 204 may be scanned by the one or more illumination beams 108 arranged along the scan direction, where the one or more illumination beams 108 sequentially interact with gratings of the side-by-side grating 206 as the overlay metrology target 204 is scanned (e.g., the first exposure structure 208 is scanned first and then second exposure structure 212 is scanned second). Referring to FIGS. 5A-6C, the overlay metrology target 204 may be scanned by the one or more illumination beams 108 arranged orthogonal to the scan direction, where the one or more illumination beams 108 simultaneously interact with all gratings (e.g., first exposure structure 208, second exposure structures 212, and in some instances the third exposure structure 216) of the side-by-side grating 206 as the overlay metrology target 204 is scanned.

In embodiments, while the illumination beam 108 scans over the multi-layer overlay target 204, the first-order signals may be mixed with the 0-order signals and collected separately in time.

For example, the overlapping area between the first-order signals and the 0-order signals may oscillate as a function of illumination spot location, as shown and described by Equation 1 below.

$$I_{\pm 1} = |E_0 + E_{\pm 1}|^2 = |E_0|^2 + |E_{\pm 1}|^2 + 2|E_0 E_{\pm 1}| = 2A_{\pm 1}A_0\cos\left[\frac{2\pi}{P_1}(X - X_0) \pm \varphi\right] + \text{constant} \qquad \text{Equation 1}$$

where $i_{\pm 1}$ is the intensity of the interference signals in the overlap region of the 0-order and first-order signals, respectively, and $E_0$ is the electric field amplitude at 0-order diffraction lobe, $E_{\pm 1}$ electric field amplitude at first-order diffraction lobe, $A_{\pm 1}$ is the amplitude of the first-order signal, $A_0$ is the amplitude of the 0-order signal, x is the position of the grating, φ is constant phase term, and $P_1$ is pitch.

In embodiments, the phase differences of the first-order signals from each individual grating may be used to measure the position of the grating relative to the system. For example, the position of the grating relative to the system may be determined based on the phase shift of the first-orders, as shown and described by Equations 2.1-2.3 below:

$$\phi_{1,\pm 1} = -\frac{2\pi}{P_1}X_0 \pm \varphi \qquad \text{Equation 2.1}$$

$$X_0 = \frac{1}{4\pi}(P(\phi_{1,1} + \phi_{1,-1})) \qquad \text{Equation 2.2}$$

$$X_0 = \frac{1}{4\pi}(P(\phi_{2,1} + \phi_{2,-1})) \qquad \text{Equation 2.3}$$

where $\phi_{1,\pm 1}$ is the phase shift of the first-order signals (±1) at a first cell (1), $\phi_{2,\pm 1}$ is the phase shift of the first-order signals (±1) at a second cell (2), P is pitch, and $X_0$ is the position of the grating relative to the system, where Equation 2.2 may be used to determine the position of the first exposure structure 208 relative to the system and Equation 2.3 may be used to determine the position of the second exposure structure 212 relative to the system.

As previously discussed herein, the overlay target 204 may include at least one diffraction grating that is non-overlapping (e.g., not stacked). Thus, the phase information for non-overlapping regions on the overlay target 204 need to be synchronized in order to determine overlay. In embodiments, the phase information for non-overlapping regions on the overlay target 204 are synchronized by providing that the one or more illumination beams 108 simultaneously interact with all gratings of the side-by-side grating 206 as the overlay metrology target 204 is scanned. For instance, as discussed further herein, the one or more illumination beams 108 may be elongated or split, such that the one or more illumination beams 108 simultaneously interact with all gratings. of the side-by-side grating 206. In this regard, the simultaneous interaction with all gratings of the side-by-side grating 206 inherently synchronizes the phase information for the non-overlapping regions on the overlay target 204 because the phase information is collected simultaneously.

In embodiments, the phase information for non-overlapping regions on the overlay target 204 are synchronized after the overlay metrology target 204 is scanned. For example, as the one or more illumination beams 108 scan the overlay metrology target 204, the one or more illumination beams 108 may sequentially interact with the gratings of the side-by-side grating 206 as the overlay metrology target 204 is scanned, such that the phase information is collected sequentially. As such, the phase information may be synchronized after scanning by determining one or more regions of interest, where the phase of the second exposure structure may be referred to the same starting point as the phase of the first exposure structure to enable relative position extraction, as will be discussed further herein.

In embodiments, the overlay error between the one or more sample layers associated with the side-by-side gratings 206 may be determined based on Equation 3, as shown and described by:

$$OVL = \frac{P_1}{4\pi}(\phi_{1,1} + \phi_{1,-1} - \phi_{2,1} - \phi_{2,-1}) \qquad \text{Equation 3}$$

FIG. 4A is a schematic view of an illumination beam spot on the overlay target shown in FIG. 2A, in accordance with one or more embodiments of the present disclosure. FIG. 4B is a top view grating diffraction lobes associated with the overlay target shown in FIG. 2A along with associated phase extraction information from the overlay target, in accordance with one or more embodiments of the present disclosure.

Referring to FIG. 4A, in embodiments, the overlay metrology target 204 is scanned by the one or more illumination beams 108 of the illumination sub-system 106, where the first exposure structure 208 and the second exposure structure 212 of the side-by-side grating 206 are scanned sequentially as the overlay metrology target 204 is scanned. For example, as previously discussed herein, the first exposure structure 208 and the second exposure structure 212 may be arranged along the scan direction. In this regard, the first exposure structure 208 of the first layer 210 may be scanned first and the second exposure structure 212 of the second layer 214 may be scanned second.

As previously discussed herein, the phase information for non-overlapping regions on the overlay target 204 may be synchronized after the overlay metrology target 204 is scanned, such that the phase information may be synchronized after scanning by determining one or more regions of interest, where the phase of the second exposure structure may be referred to the same starting point as the phase of the first exposure structure to enable relative position extraction.

In embodiments, where the overlay metrology target 204 is scanned by the one or more illumination beams 108 arranged along the scan direction, one or more corrections may be performed.

In embodiments, one or more regions of interest (ROIs) may be determined. For example, the one or more ROIs may enable relative position extraction during phase extraction.

In embodiments, as shown in FIG. 4A, where the scanning velocity is stable, the one or more ROIs 400, 402 may be defined by a shift of n times the period of the grating, where n is an integer greater than 1. In this regard, the separation between a first ROI 400 associated with the first exposure structure 208 and a second ROI 402 associated with the second exposure structure 212 may be defined by the shift of n times the period of the grating, where the starting point of the first exposure structure 208 and the second exposure structure 212 is the same to enable relative position extraction. Referring to FIG. 4B, for example, the one or more ROIs 400, 402 may be defined by a shift of n times the pitch of the time-varying interference signal, where n is an integer greater than 1. In this regard, the separation between a first ROI 400 associated with time-varying interference signal of the first exposure structure 208 and a second ROI 402 associated with time-varying interference signal of the second exposure structure 212 may be defined by the shift of n times the pitch of the time-varying interference signal, where the starting point of the first exposure structure 208 and the second exposure structure 212 is the same to enable relative position extraction.

However, it is contemplated herein that errors may originate from the stability of the scanning velocity. As such, in some embodiments, where the scanning velocity is unstable, the time-varying interference signals may be calibrated (or corrected) to compensate for scanning velocity instability or other sample instabilities. For example, one or more sample reference signals may be used to perform one or more corrections. The one or more sample reference signals may be received from the stage itself (e.g., via a stage encoder) or an external monitoring system. In this regard, the velocity of the stage (or sample) may be monitored and used as an anchor to perform one or more corrections to adjust the phase information of the respective time-varying interference signals.

Figure 5A:
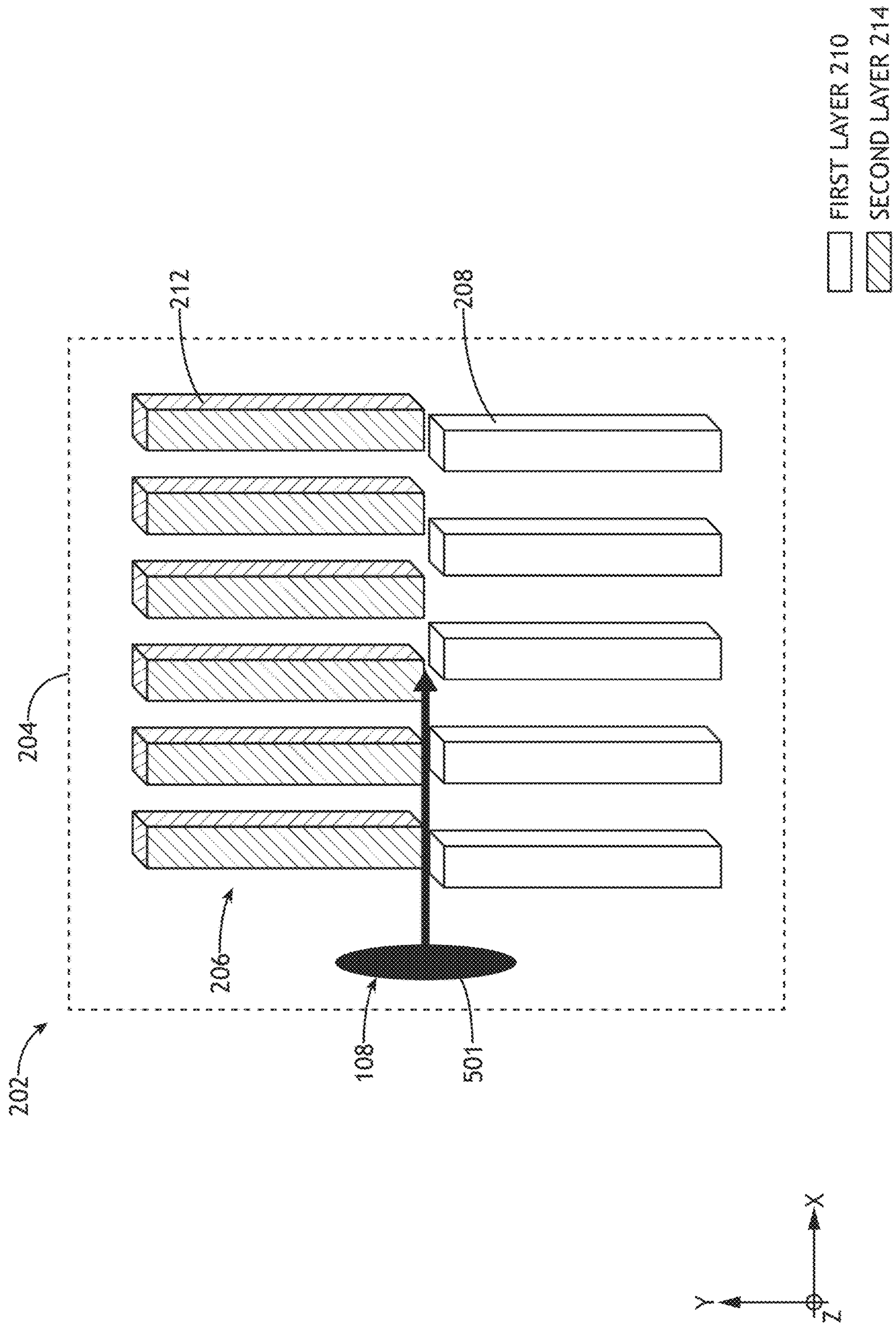
FIG. 5A is a schematic view of an illumination beam spot on the overlay target shown in FIG. 2B, in accordance with one or more embodiments of the present disclosure.
Figure 5B:
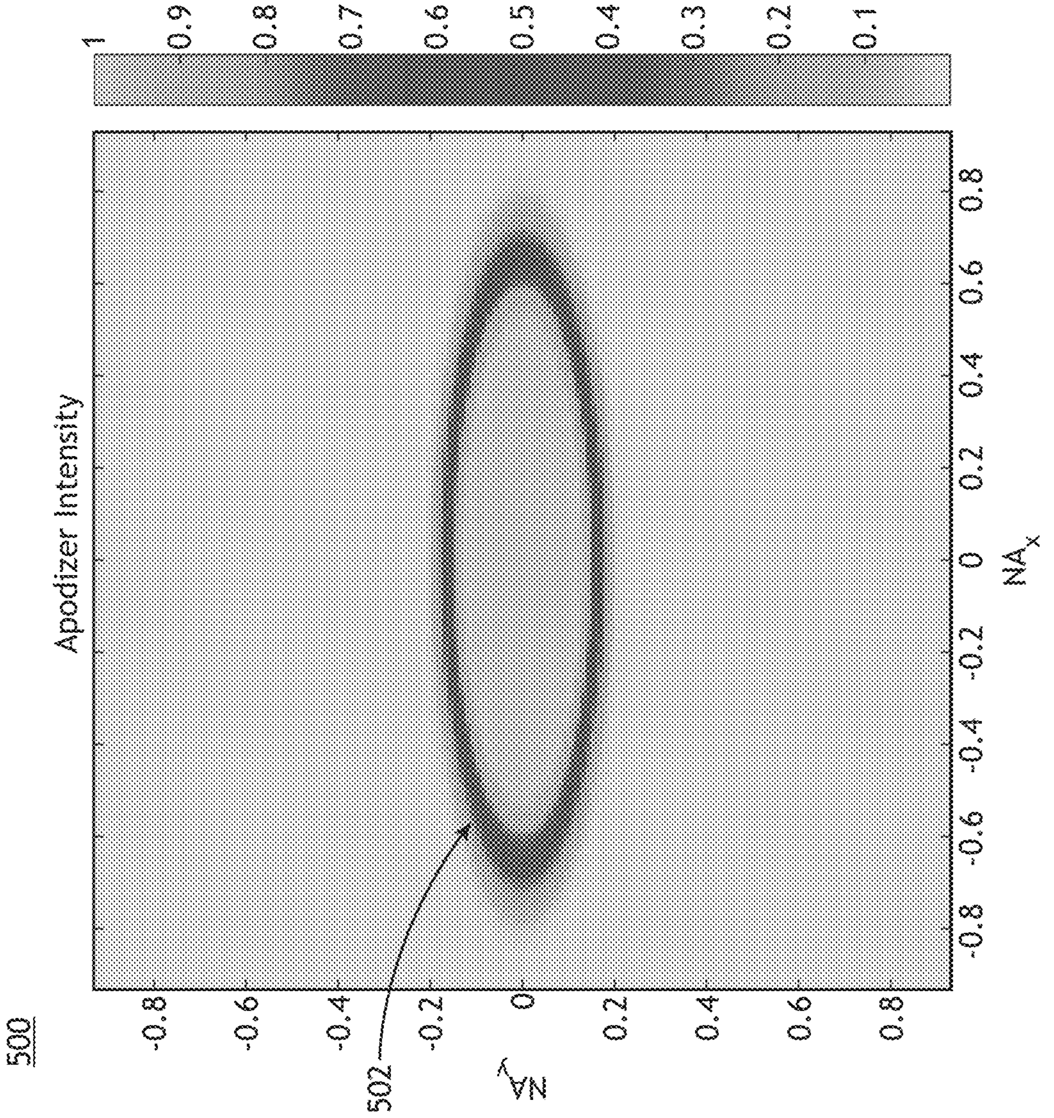
FIG. 5B is a plot depicting an apodizer intensity of the illumination beam spot associated with the illumination beam spot shown in FIG. 4A, in accordance with one or more embodiments of the present disclosure.
Figure 5C:
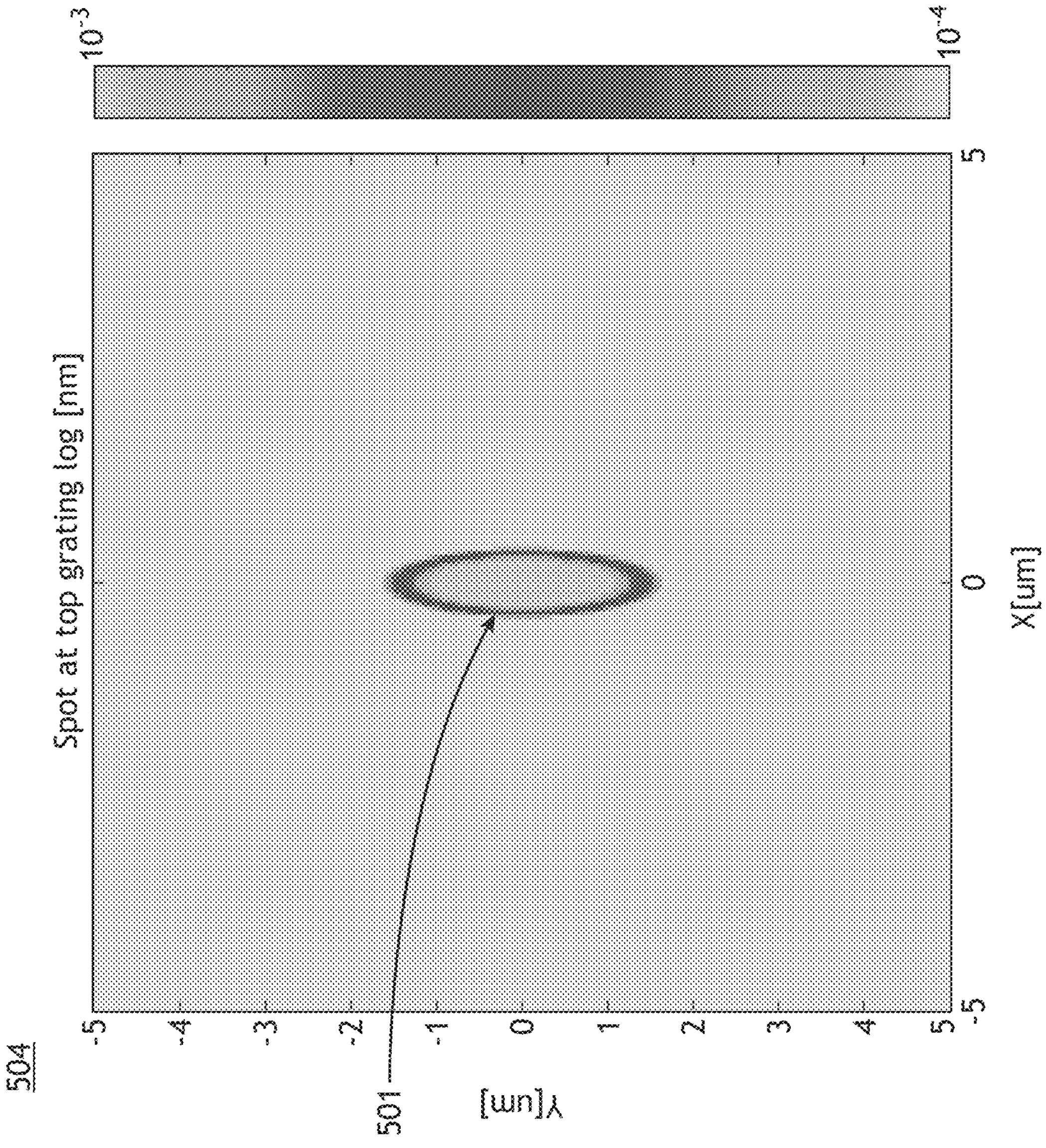
FIG. 5C is a plot depicting a simulated spot associated with the apodizer intensity plot shown in FIG. 5B, in accordance with one or more embodiments of the present disclosure.

FIG. 5A is a schematic view of a cell 202 of an overlay metrology target 204 being scanned with an illumination beam 108, in accordance with one or more embodiments of the present disclosure. FIG. 5B is a graph 500 depicting an apodizer function 502 used to generate the illumination beam 108 in FIG. 5A, in accordance with one or more embodiments of the present disclosure. FIG. 5C is a graph 504 depicting a simulated illumination spot 501 generated using the apodizer function 502 in FIG. 5B, in accordance with one or more embodiments of the present disclosure.

Referring to FIGS. 5A-5C, in embodiments, the one or more illumination beams 108 are elongated orthogonally in the scan direction. For example, the one or more illumination beams 108 may be elongated orthogonally in the scan direction such that the one or more illumination beams 108 interact with the first exposure structure 208 and the second exposure structure 212.

In embodiments, one or more optical elements 134 of the illumination sub-system 106 may be used to modify the one or more illumination beams 108. For example, an apodizer function 502 in the pupil field may be used to generate an elongated illumination beam 501. For instance, the apodization function 502 in the pupil field shown in FIG. 5B may be used to generate the elongated illumination beam 501. In this regard, as shown in FIG. 5A, the elongated illumination beam 501 may interact with the first exposure structure 208 and the second exposure structure 212 of the side-by-side grating 206 as the overlay target 204 is scanned.

Figure 6A:
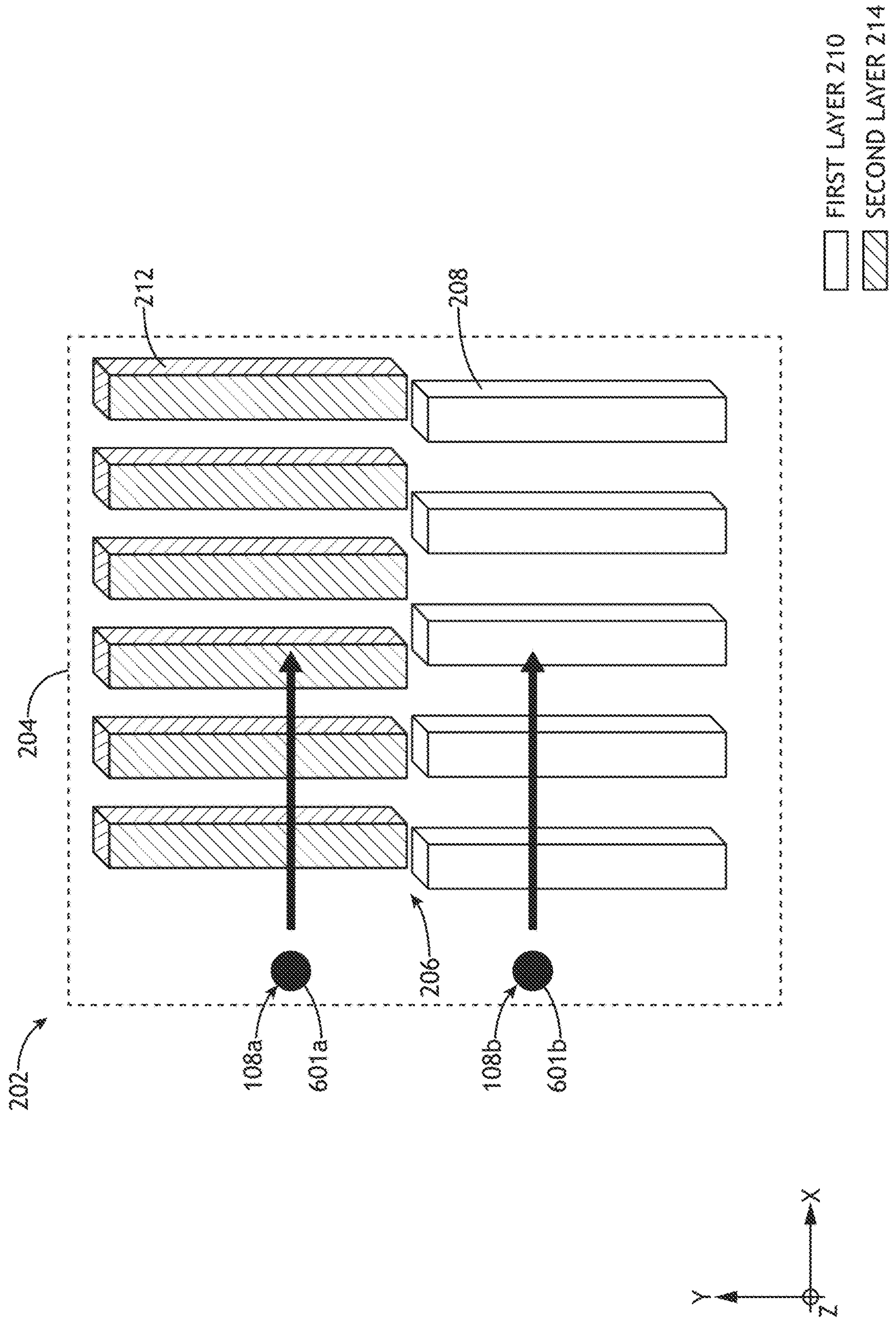
FIG. 6A is a schematic view of a plurality of illumination beam spots on the overlay target shown in FIG. 2C, in accordance with one or more embodiments of the present disclosure.
Figure 6B:
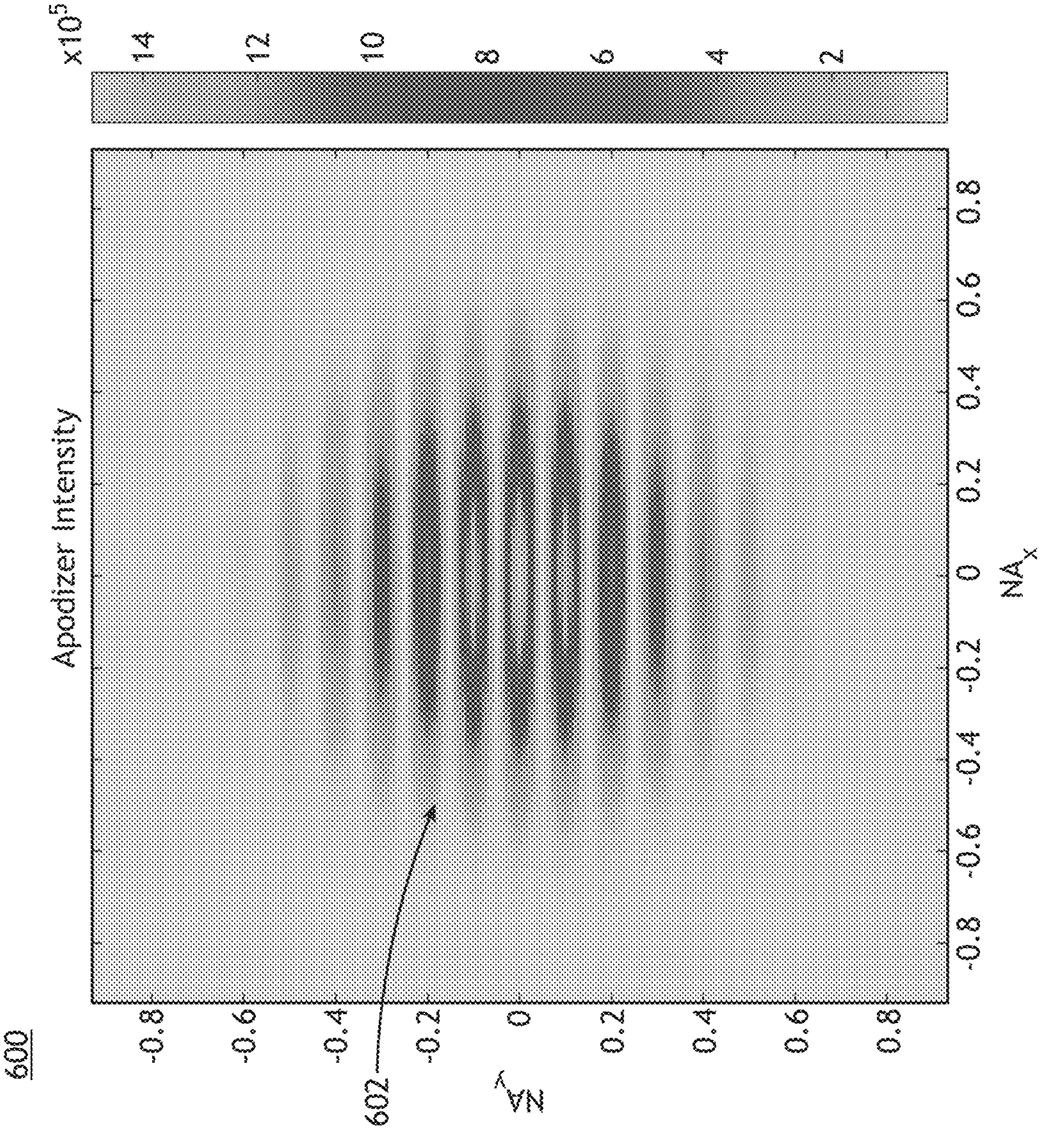
FIG. 6B is a plot depicting an apodizer intensity of the plurality of illumination beam spots associated with the illumination beam spot shown in FIG. 6A, in accordance with one or more embodiments of the present disclosure.
Figure 6C:
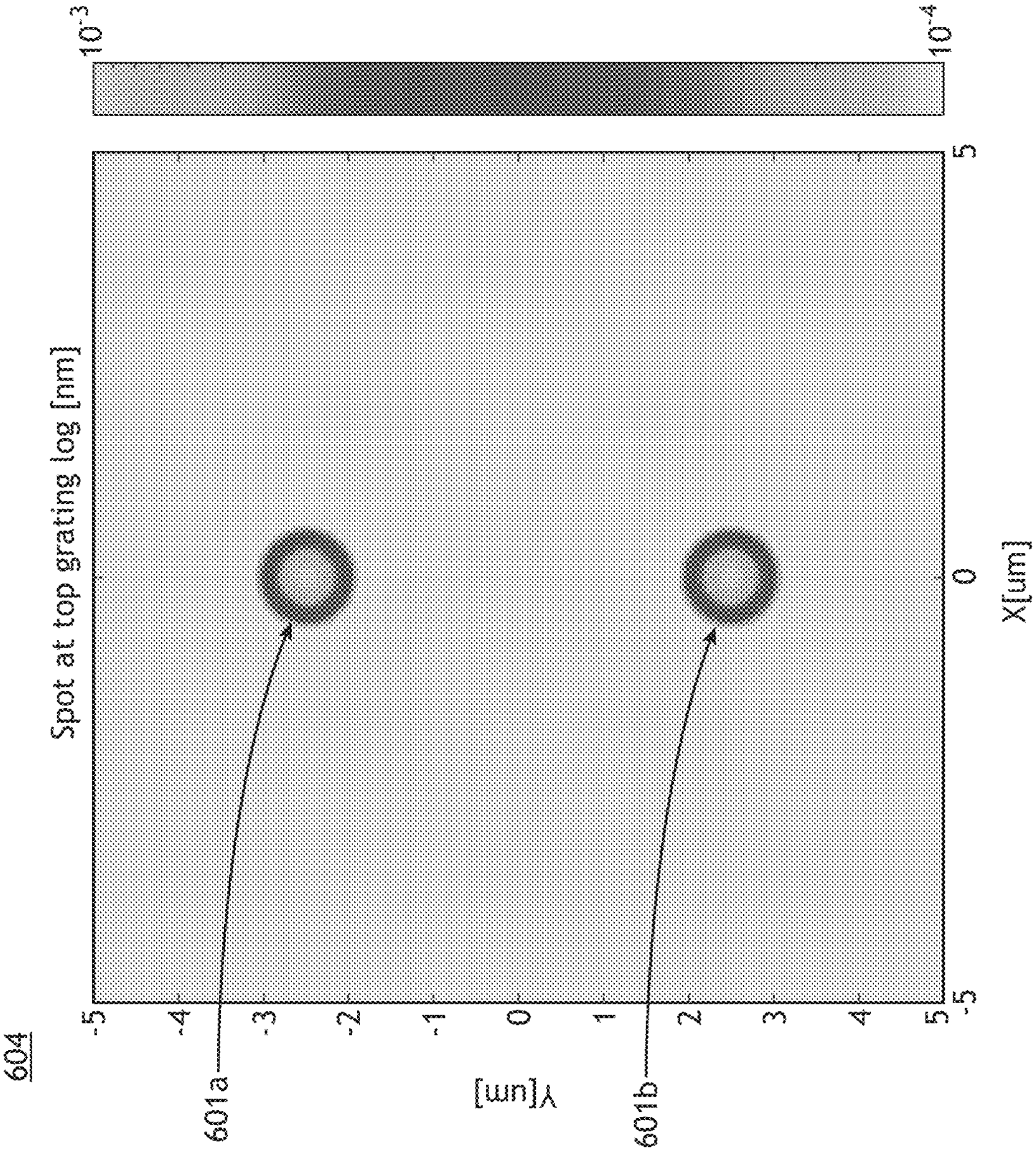
FIG. 6C is a plot depicting a plurality of simulated spots associated with the apodizer intensity plot shown in FIG. 6B, in accordance with one or more embodiments of the present disclosure.

FIG. 6A is a schematic view of a cell 202 of an overlay metrology target 204 being scanned with two mutually coherent illumination beams 108, in accordance with one or more embodiments of the present disclosure. FIG. 6B is a graph 600 depicting an apodizer function 602 used to generate the separated illumination beams 108 in FIG. 6A, in accordance with one or more embodiments of the present disclosure. FIG. 6C is a graph 604 depicting separated simulated illumination spots 601*a,b* generated using the apodizer function 602 in FIG. 6B, in accordance with one or more embodiments of the present disclosure.

Referring to FIGS. 6A-6C, in embodiments, the one or more illumination beams 108 are separated to generate two mutually coherent separate illumination beams 108 in the pupil field. For example, the one or more illumination beams 108 may be separated to generate two separate illumination beams 108*a*, 108*b*. For instance, a first illumination beam 108*a* may interact with the first exposure structure 208 and a second illumination beam 108*b* may interact with the second exposure structure 212.

In embodiments, one or more optical elements 134 of the illumination sub-system 134 (e.g., apodizers) may be used to generate the separated illumination beams 601*a*, 601*b* by separating the one or more illumination beams 108. For example, an apodizer function 602 in the pupil field may be used to generate the separated illumination beams 601*a*, 601*b*, where the separated illumination beams 601*a*, 601*b* are mutually coherent. For instance, the apodization spot 602 in the pupil field shown in FIG. 6B may be used to generate the separated illumination beams 601*a*, 601*b*. In this regard, as shown in FIG. 6A, the separated illumination beams 601*a*, 601*b* may simultaneously interact with the first exposure structure 208 and the second exposure structure 212 of the side-by-side grating 206 as the overlay target 204 is scanned.

Although FIGS. 6A-6C depict two spots, it is noted that FIGS. 6A-6C are provided merely for illustrative purposes and shall not be construed as the limiting the scope of the present disclosure. For example, the system and method of the present disclosure may be used to measure three or more side-by-side gratings.

Referring again to FIG. 1A, additional components of the overlay metrology tool 102 are described in greater detail in accordance with one or more embodiments of the present disclosure.

In embodiments, the overlay metrology system 100 includes a controller 122 communicatively coupled to the overlay metrology tool 102. The controller 122 may include one or more processors 124 and a memory device 126, or memory. For example, the one or more processors 124 may be configured to execute a set of program instructions maintained in the memory device 126.

In embodiments, the controller 122 may execute any of various processing steps associated with overlay metrology. For example, the controller 122 may be configured to generate control signals to direct or otherwise control the overlay metrology tool 102, or any components thereof. For instance, the controller 122 may be configured to direct the translation stage 116 to translate the sample 104 along one or more measurement paths, or swaths, to scan one or more overlay targets through a measurement field of view of the overlay metrology tool 102 and/or direct the beam-scanning sub-system 118 to position or scan one or more modified illumination beams on the sample 104. By way of another example, the controller 122 may be configured to receive signals corresponding to the time-varying interference signals from the photodetectors 112. By way of another example, the controller 122 may generate correctables for one or more additional fabrication tools as feedback and/or feed-forward control of the one or more additional fabrication tools based on overlay measurements from the overlay metrology tool 102.

In embodiments, the controller 122 captures the interference signals detected by the photodetectors 112. For example, the controller 122 may generally capture data such as, but not limited to, the phases of the time-varying interference signals using any technique known in the art such as, but not limited to, frequency-domain analysis (e.g., FFT), one or more phase-locked loops, and the like. Further, the controller 122 may capture the interference signals, or any data associated with the interference signals, using any combination of hardware (e.g., circuitry) or software techniques.

In embodiments, the controller 122 determines an overlay measurement between layers of the overlay target along the measurement direction based on the comparison of the interference signals. For example, the controller 122 may determine an overlay measurement based on the phases of the interference signals. For instance, U.S. Pat. No. 10,824,079 referenced above and incorporated herein by reference in its entirety generally describes the electric field of diffracted orders in a collection pupil and further provides specific relationships between overlay and measured intensity in the pupil plane. It is contemplated herein that the systems and methods disclosed herein may extend the teachings of U.S. Pat. No. 10,824,079 to time-varying interference signals captured by photodetectors placed in overlap regions between 0 and +/−1 diffraction orders. In particular, it is contemplated herein that overlay on a sample may be proportional to the relative phase shift between the two time-varying interference signals.

Further, the controller 122 may calibrate or otherwise modify the overlay measurement based on known, assumed, or measured features of the sample that may also impact the time-varying interference signals such as, but not limited to, sidewall angles or other sample asymmetries.

In embodiments, the illumination sub-system 106 includes an illumination source 128 configured to generate at least one illumination beam 108. The illumination from the illumination source 128 may include one or more selected wavelengths of light including, but not limited to, ultraviolet (UV) radiation, visible radiation, or infrared (IR) radiation.

The illumination source 128 may include any type of illumination source suitable for providing at least one illumination beam 108. In some embodiments, the illumination source 128 is a laser source. For example, the illumination source 128 may include, but is not limited to, one or more narrowband laser sources, a broadband laser source, a supercontinuum laser source, a white light laser source, or the like. In this regard, the illumination source 128 may provide an illumination beam 108 having high coherence (e.g., high spatial coherence and/or temporal coherence). In some embodiments, the illumination source 128 includes a laser-sustained plasma (LSP) source. For example, the illumination source 128 may include, but is not limited to, an LSP lamp, an LSP bulb, or an LSP chamber suitable for containing one or more elements that, when excited by a laser source into a plasma state, may emit broadband illumination.

In embodiments, the illumination sub-system 106 includes one or more optical components suitable for modifying and/or conditioning the illumination beam 108 as well as directing the illumination beam 108 to the sample 104. For example, the illumination sub-system 106 may include one or more illumination lenses 130 (e.g., to collimate the illumination beam 108, to relay an illumination pupil plane 120 and/or an illumination field plane 132, or the like). In some embodiments, the illumination sub-system 106 includes one or more illumination control optics 134 to shape or otherwise control the illumination beam 108. For example, the illumination control optics 134 may include, but are not limited to, one or more apodizers, one or more field stops, one or more pupil stops, one or more polarizers, one or more filters, one or more beam splitters, one or more diffusers, one or more homogenizers, one or more beam shapers, or one or more mirrors (e.g., static mirrors, translatable mirrors, scanning mirrors, or the like).

In embodiments, the overlay metrology tool 102 includes an objective lens 136 to focus the illumination beam 108 onto the sample 104 (e.g., an overlay target with overlay target elements located on two or more layers of the sample 104).

In embodiments, the illumination sub-system 106 illuminates the sample 104 with two or more illumination beams 108. Further, the two or more illumination beams 108 may be, but are not required to be, incident on different portions of the sample 104 (e.g., different cells of an overlay target) within a measurement field of view (e.g., a field of view of the objective lens 136). It is contemplated herein that the two or more illumination beams 108 may be generated using a variety of techniques. In some embodiments, the illumination sub-system 106 includes two or more apertures at an illumination field plane 132. In some embodiments, the illumination sub-system 106 includes one or more beam-splitters to split illumination from the illumination source 128 into the two or more illumination beams 108. In some embodiments, at least one illumination source 128 generates two or more illumination beams 108 directly. In a general sense, each illumination beam 108 may be considered to be a part of a different illumination channel regardless of the technique in which the various illumination beams 108 are generated.

In embodiments, the collection sub-system 110 includes at least two photodetectors 112 (e.g., photodetectors 112*a,b*) located at a collection pupil plane 114 configured to capture light from the sample 104 (e.g., collected light 138), where the collected light 138 includes at least the 0-order diffraction 306, the −1 order diffraction 308, and the +1 order diffraction 310 as illustrated in FIG. 3B. The collection sub-system 110 may include one or more optical elements suitable for modifying and/or conditioning the collected light 138 from the sample 104. In some embodiments, the collection sub-system 110 includes one or more collection lenses 140 (e.g., to collimate the illumination beam 108, to relay pupil and/or field planes, or the like), which may include, but are not required to include, the objective lens 136. In some embodiments, the collection sub-system 110 includes one or more collection control optics 142 to shape or otherwise control the collected light 138. For example, the collection control optics 142 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In embodiments, the collection sub-system 110 includes two or more collection channels 144, each with a separate pair of photodetectors 112. For example, as illustrated in FIG. 1B, the overlay metrology tool 102 may include one or more beamsplitters 146 arranged to split the collected light 138 into the collection channels 144. Further, the beamsplitters 146 may be polarizing beamsplitters, non-polarizing beamsplitters, or a combination thereof. It is to be understood, however, that the illustration of two collection channels 144 in FIG. 1B is provided solely for illustrative purposes and should not be interpreted as limiting. For example, the collection sub-system 110 may include a single collection channel 144 or multiple collection channels 144.

In embodiments, multiple collection channels 144 are configured to collect light from multiple illumination beams 108 on the sample 104. For example, in the case that an overlay target 204 has one or more cells 202 distributed in a direction different than a scan direction, the overlay metrology tool 102 may simultaneously illuminate the different cells 202 with different illumination beams 108 and simultaneously capture interference signals associated with each illumination beam 108. Additionally, in some embodiments, multiple illumination beams 108 directed to the sample 104 may have different polarizations. In this way, the diffraction orders associated with each of the illumination beams 108 may be separated. For example, polarizing beamsplitters 146 may efficiently separate the diffraction orders associated with the different illumination beams 108. By way of another example, polarizers may be used in one or more collection channels 144 to isolate desired diffraction orders for measurement.

In embodiments, the overlay metrology tool 102 includes a beam-scanning sub-system 118 to position, scan, or modulate positions of one or more illumination beams 108 on the sample 104 during measurement.

The beam-scanning sub-system 118 may include any type or combination of elements suitable for scanning positions of one or more illumination beams 108. In some embodiments, the beam-scanning sub-system 118 includes one or more deflectors suitable for modifying a direction of an illumination beam 108. For example, a deflector may include, but is not limited to, a rotatable mirror (e.g., a mirror with adjustable tip and/or tilt). Further, the rotatable mirror may be actuated using any technique known in the art. For example, the deflector may include, but is not limited to, a galvanometer, a piezo-electric mirror, or a micro-electro-mechanical system (MEMS) device. By way of another example, the beam-scanning sub-system 118 may include an electro-optic modulator, an acousto-optic modulator, or the like.

The deflectors may further be positioned at any suitable location in the overlay metrology tool 102. In some embodiments, one or more deflectors are placed at one or more pupil planes common to both the illumination sub-system 106 and the collection sub-system 110. In this regard, the beam-scanning sub-system 118 may be a pupil-plane beam scanner and the associated deflectors may modify the positions of one or more illumination beams 108 on the sample 104 without impacting positions of diffraction orders in the collection pupil plane 114. Further, a distribution of one or more illumination beams 108 in an illumination field plane 132 may further be stable as the beam-scanning sub-system 118 modifies positions of the one or more illumination beams 108 on the sample 104. Pupil-plane beam scanning is described generally in U.S. patent application Ser. No. 17/142,783, filed on Jan. 6, 2021, which is incorporated by reference in its entirety.

Figure 7:
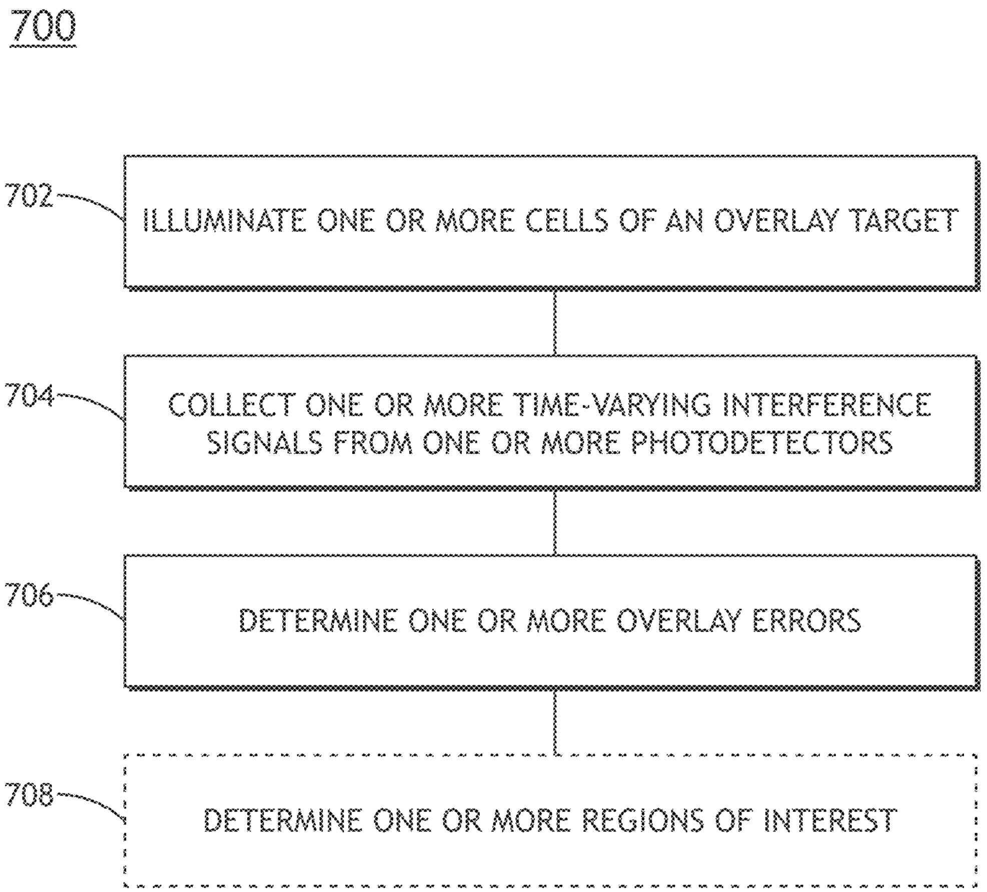
FIG. 7 is a flow diagram illustrating steps performed in a method for scanning overlay metrology of overlay targets, in accordance with one or more embodiments of the present disclosure.

FIG. 7 is a flow diagram illustrating steps performed in a method 700 for scanning overlay metrology of overlay targets, in accordance with one or more embodiments of the present disclosure. Applicant notes that the embodiments and enabling technologies described previously herein in the context of the overlay metrology system 100 should be interpreted to extend to the method 700. It is further noted, however, that the method 700 is not limited to the architecture of the overlay metrology system 100.

In a step 702, one or more cells of an overlay target are illuminated. For example, the one or more cells 202 of the overlay target 204 on the sample 104 are illuminated as the sample 104 is scanned with respect to the illumination.

In one instance, the overlay metrology target 204 may be scanned by the one or more illumination beams 108 arranged orthogonal to the scan direction, where the one or more illumination beams 108 simultaneously interact with all gratings (e.g., first exposure structure 208, second exposure structure 212, and in some instances, a third exposures structure 216) of the side-by-side grating 206 as the overlay metrology target 204 is scanned. In another instance, the overlay metrology target 204 may be scanned by the one or more illumination beams 108 arranged along the scan direction, where the one or more illumination beams 108 sequentially interact with gratings of the side-by-side grating 206 as the overlay metrology target 204 is scanned (e.g., first exposure structure 208 is scanned first and then second exposure structure 212 is scanned second).

In a step 704, time-varying interference signals from one or more photodetectors 112*a,b* may be collected. For example, the time-varying interference signals from the two photodetectors 112*a,b* placed in regions of the collection pupil associated with overlapping diffraction from the gratings in the side-by-side gratings 206. For instance, non-limiting configurations may include, but are not limited to, photodetectors may be placed at locations including exclusively grating diffraction orders, both grating diffraction orders and 0-order diffraction, or first-order diffraction from gratings of a side-by-side grating 206. In this regard, while the illumination beam 108 scans over the multi-layer overlay target 204, the first-order signals and the 0-order signals (or split illumination/auxiliary illumination) may form time-varying interference signals described herein, where the overlapping area between the 0-order signals (or auxiliary illumination) and the first-order signals may oscillate as a function of illumination spot location, in accordance with Equation 1 discussed previously herein.

In a step 706, an overlay error between the one or more sample layers associated with the side-by-side gratings may be determined, in accordance with Equations 2-1-3 shown and described above. For example, the overlay error between sample layers associated with the side-by-side gratings in the one or more cells 202 of the overlay target 204 are determined based on the signals from the two photodetectors 112*a,b*. For instance, an overlay error along a direction of periodicity of the side-by-side gratings 206 may be proportional to a phase difference between the time-varying interference signals from the two photodetectors. The phase difference may be determined using any technique known in the art including, but not limited to, frequency-domain analysis techniques (e.g., Fast Fourier Transform, or the like) applied to the two time-varying interference signals. Further, in some embodiments, overlay measurements of the sample along a particular measurement direction may be generated based on data from multiple cells of the overlay target with side-by-side gratings having periodicity along the particular measurement direction.

It is contemplated herein that the method 700 may be applied to a wide variety of overlay target designs suitable for 1 D or 2D metrology measurements.

In some embodiments, an overlay measurement is generated based on signals from an overlay target with multiple cells having different variations of a side-by-side grating (e.g., different pitches). For example, in an optional step 708, tool-induced-shift (TIS) errors may be reduced or eliminated by averaging measurements. For instance, the TIS error of the overlay target 204 may be determined based on a difference between the overlay error one or more of the plurality of cells 202.

In embodiments, the TIS error may be determined based on the overlay error between the plurality of cells 202. For example, in general, TIS correction by two layers is done by averaging measurements from two cells with inverted pitch distributions for those layers (e.g., PQ/QP, PR/RP, QR/RP). Determination of TIS errors is generally discussed in U.S. patent Ser. No. 18/099,798, filed on Dec. 20, 2023, which is incorporated by reference herein in the entirety.

In embodiments, the method 700 includes simultaneously scanning multiple illumination beams and collecting the associated overlapping diffraction orders for parallel measurements.

In embodiments, the method 700 includes scanning one or more illumination beams along a beam-scan direction different than the stage-scan direction to provide a diagonal or triangle-wave path across the sample. In this regard, cells having side-by-side gratings with different directions of periodicity may be efficiently interrogated by a common illumination beam in a measurement swath.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:

an illumination sub-system comprising:

an illumination source configured to generate one or more illumination beams; and one or more illumination optics configured to direct the one or more illumination beams to an overlay target on a sample as the sample is scanned relative to the one or more illumination beams along a scan direction when implementing a metrology recipe, wherein the overlay target in accordance with the metrology recipe includes a side-by-side grating, wherein the side-by-side grating includes one or more diffraction gratings in one or more cells, wherein at least one diffraction grating is a non-overlapping side-by-side grating, wherein the side-by-side grating includes at least a first exposure structure and a second exposure structure, wherein the first exposure structure is arranged adjacent to the second exposure structure, wherein the side-by-side grating is periodic along the scan direction;

a collection sub-system comprising:

two or more photodetectors located in a pupil plane to capture diffraction orders from the side-by-side grating in the one or more cells when implementing the metrology recipe;

a controller communicatively coupled to the two or more photodetectors, the controller including one or more processors configured to execute program instructions causing the one or more processors to:

receive time-varying interference signals from the two or more photodetectors associated with the side-by-side gratings in the one or more cells as the overlay target is scanned in accordance with the metrology recipe;

extract phase information from the time-varying interference signals associated with the non-overlapping first exposure structure and second exposure structure;

synchronize the phase information from the non-overlapping first exposure structure and second exposure structure by at least one of (i) simultaneously interacting the one or more illumination beams with all gratings of the side-by-side grating during scanning, (ii) determining regions of interest (ROIs) for each exposure structure and aligning the phase information to a common starting point, or (iii) adjusting the phase information based on sample reference signals to compensate for scanning velocity instability;

determine an overlay error between one of the first exposure structure and the second exposure structure of the sample based on the synchronized phase information from the non-overlapping first exposure structure and second exposure structure.

2. The overlay metrology system of claim 1, wherein the one or more illumination beams simultaneously interact with the first exposure structure of a first layer of the side-by-side grating and the second exposure structure of a second layer of the side-by-side grating as the sample is scanned relative to the one or more illumination beams.

3. The overlay metrology system of claim 1, wherein the two or more photodetectors are located in the pupil plane at two or more locations, wherein a first location including a first photodetector includes a location of +1 grating order diffraction associated with grating diffraction from the first exposure structure and 0-order diffraction, wherein a second location including a second photodetector includes a location of −1 grating order diffraction associated with grating diffraction from the second exposure structure and 0-order diffraction.

4. The overlay metrology system of claim 1, wherein the one or more illumination optics direct the one or more illumination beams to the overlay target at a normal incidence angle.

5. The overlay metrology system of claim 1, wherein the one or more illumination beams comprise:

a temporally coherent illumination beam.

6. The overlay metrology system of claim 1, further comprising:

a translation stage to translate the sample along the scan direction, wherein the one or more illumination optics direct the illumination beam to the overlay target on the sample as the sample is scanned by the translation stage.

7. The overlay metrology system of claim 1, further comprising:

one or more beam-scanning optics to scan the illumination beam along the scan direction.

8. The overlay metrology system of claim 1, wherein the one or more illumination beams sequentially interact with the first exposure structure and the second exposure structure of the side-by-side grating as the sample is scanned relative to the one or more illumination beams.

9. The overlay metrology system of claim 8, wherein the first exposure structure and the second exposure structure have identical pitches.

10. The overlay metrology system of claim 1, wherein the first exposure structure has a first pitch and the second exposure structure has a second pitch, wherein the first pitch is different than the second pitch.

11. The overlay metrology system of claim 10, wherein the one or more processors are configured to execute program instructions causing the one or more processors to:

determine a tool-induced shift error based on the time-varying interference signals.

12. The overlay metrology system of claim 1, wherein the one or more illumination beams comprised one or more elongated beams, wherein the one or more elongated beams are elongated orthogonally in the scan direction, wherein the one or more elongated beams simultaneously interact with at least the first exposure structure and the second exposure structure as the overlay target is scanned.

13. The overlay metrology system of claim 12, wherein the one or more illumination optics are configured to modify the one or more illumination beams to generate the one or more elongated beams.

14. The overlay metrology system of claim 13, wherein the one or more illumination optics comprise one or more apodizers.

15. The overlay metrology system of claim 12, wherein the illumination source is configured to generate the one or more elongated beams.

16. The overlay metrology system of claim 1, wherein the one or more illumination beams comprise one or more separated illumination beams, wherein a first illumination beam of the one or more separated illumination beams interacts with the first exposure structure and a second illumination beam of the one or more separated illumination beams interacts with the second exposure structure as the overlay target is scanned.

17. The overlay metrology system of claim 16, wherein the one or more illumination optics are configured to separate the one or more illumination beams to generate the one or more separated illumination beams.

18. The overlay metrology system of claim 17, wherein the one or more illumination optics comprise one or more apodizers.

19. The overlay metrology system of claim 1, wherein the one or more processors are configured to execute program instructions causing the one or more processors to:

extract phase information associated with the time-varying interference signals; and determine the overlay error between the first exposure structure and the second exposure structure of the sample based on the phase information.

20. The overlay metrology system of claim 19, wherein the phase information associated with the time-varying interference signals are extracted using a Fast Fourier Transform technique.

21. The overlay metrology system of claim 19, wherein the one or more processors are configured to execute program instructions causing the one or more processors to:

receive one or more sample reference signals; and adjust the extracted phase information associated with the time-varying interference signals based on the received one or more sample reference signals.

22. The overlay metrology system of claim 19, wherein the one or more processors are configured to execute program instructions causing the one or more processors to:

determine one or more regions of interest (ROI) for the first exposure structure and the second exposure structure of the side-by-side grating.

23. The overlay metrology system of claim 22, wherein an ROI of the second exposure structure is defined as a shift of n times the period of the second exposure structure relative to an ROI of a first exposure structure.

24. A method comprising:

receiving time-varying interference signals from two or more photodetectors associated with a first exposure structure and a second exposure structure in one or more cells as an overlay target is scanned in accordance with a metrology recipe, wherein the first exposure structure and the second exposure structure form a side-by-side grating, wherein the side-by-side grating includes one or more diffraction gratings, wherein at least one diffraction grating is a non-overlapping side-by-side grating, wherein the first exposure structure is arranged adjacent to the second exposure structure, wherein the side-by-side grating is periodic along a scan direction;

extracting phase information from the time-varying interference signals associated with the non-overlapping first exposure structure and second exposure structure;

synchronizing the phase information from the non-overlapping first exposure structure and second exposure structure by at least one of (i) simultaneously interacting the one or more illumination beams with all gratings of the side-by-side grating during scanning, (ii) determining regions of interest (ROIs) for each exposure structure and aligning the phase information to a common starting point, or (iii) adjusting the phase information based on sample reference signals to compensate for scanning velocity instability; and determining an overlay error between one of the first exposure structure and the second exposure structure of the sample based on the synchronized phase information from the non-overlapping first exposure structure and second exposure structure.

25. The method of claim 24, further comprising:

extracting phase information associated with the time-varying interference signals; and determining the overlay error between the first exposures structure and the second exposure structure of the sample based on the phase information.

26. The method of claim 24, further comprising:

receiving one or more sample reference signals; and adjusting the extracted phase information associated with the time-varying interference signals based on the received one or more sample reference signals.

27. The method of claim 24, further comprising:

determine one or more regions of interest (ROI) for the first exposure structure and the second exposure structure of the side-by-side grating.

28. The method of claim 27, wherein an ROI of the second exposure structure is defined as a shift of n times the period of the second exposure structure relative to an ROI of a first exposure structure.

* * * * *